US011448659B2

(12) United States Patent
Bussan et al.

(10) Patent No.: US 11,448,659 B2
(45) Date of Patent: Sep. 20, 2022

(54) AMR SPEED AND DIRECTION SENSOR FOR USE WITH MAGNETIC TARGETS

(71) Applicant: Honeywell International Inc., Morris Plains, NJ (US)

(72) Inventors: Anthony J Bussan, Davis Junction, IL (US); Jason Chilcote, Frisco, TX (US); Joel Stolfus, Freeport, IL (US); Junheng Zhang, Grapevine, TX (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 367 days.

(21) Appl. No.: 15/277,616

(22) Filed: Sep. 27, 2016

(65) Prior Publication Data
US 2017/0089940 A1   Mar. 30, 2017

Related U.S. Application Data

(60) Provisional application No. 62/234,432, filed on Sep. 29, 2015.

(51) Int. Cl.
*G01P 3/44* (2006.01)
*G01P 3/487* (2006.01)
(Continued)

(52) U.S. Cl.
CPC .......... *G01P 3/44* (2013.01); *G01B 7/14* (2013.01); *G01B 7/30* (2013.01); *G01D 5/145* (2013.01);
(Continued)

(58) Field of Classification Search
CPC .... G01R 33/07; G01R 33/072; G01R 33/075; G01R 33/077; G01R 33/09; G01R 33/091;
(Continued)

(56) References Cited

U.S. PATENT DOCUMENTS 2,264,834 A    12/1941  Faus
3,846,697 A    11/1974  Cila et al.
(Continued)

FOREIGN PATENT DOCUMENTS

DE    3634576 A1    4/1988
EP    0390261 A2    10/1990
JP    H11218405 A    8/1999

OTHER PUBLICATIONS

What are "Series" and "Parallel" Circuits?, All About Circuits, Chapter 5—Series and Parallel Circuits, obtained from https://www.allaboutcircuits.com/textbook/direct-current/chpt-5/what-are-series-and-parallel-circuits/, obtained on Feb. 24, 2022 (Year: 2022).*
(Continued)

*Primary Examiner* — David M Schindler
(74) *Attorney, Agent, or Firm* — Alston & Bird LLP

(57) ABSTRACT

A movement sensor comprises a multi-pole ring magnet, a semiconductor substrate, a first magnetic sensor formed on the semiconductor substrate, and a second magnetic sensor formed on the semiconductor substrate. The first magnetic sensor is configured to produce a first output signal in response to movement of the multi-pole ring magnet, and a centroid of the first and second magnetic sensors are separate and radially aligned on the semiconductor substrate relative to the multi-pole ring magnet. The second magnetic sensor is arranged at a predetermined angle with respect to the first magnetic sensor and is configured to produce a second output signal in response to the movement of the multi-pole ring magnet. The predetermined angle is between
(Continued)

0° and 90° exclusive and is configured to produce a difference in phase between the first and second output signals in response to the movement of the multi-pole ring magnet.

17 Claims, 14 Drawing Sheets

(51) Int. Cl.
| | |
|---|---|
| *G01B 7/14* | (2006.01) |
| *G01D 5/14* | (2006.01) |
| *G01B 7/30* | (2006.01) |
| *G01R 33/09* | (2006.01) |
| *G01D 5/245* | (2006.01) |
| *G01P 13/04* | (2006.01) |
| *G01P 13/02* | (2006.01) |

(52) U.S. Cl.
CPC ......... *G01D 5/2451* (2013.01); *G01D 5/2457* (2013.01); *G01P 3/487* (2013.01); *G01P 13/02* (2013.01); *G01P 13/045* (2013.01); *G01R 33/096* (2013.01)

(58) Field of Classification Search
CPC .. G01R 33/093; G01R 33/095; G01R 33/096; G01R 33/098; G01R 33/0017; G01R 33/0023; G01R 33/0029; G01R 33/0035; G01R 33/007; G01R 33/0082; G01R 33/06; G01B 7/14; G01B 7/30; G01P 3/44; G01P 3/487; G01P 13/02; G01P 13/045; G01D 5/142; G01D 5/145; G01D 5/2451; G01D 5/245; G01D 5/147; G01D 5/16; G01D 5/165; G01D 5/2457
See application file for complete search history.

(56) References Cited

U.S. PATENT DOCUMENTS

| | | | |
|---|---|---|---|
| 6,104,186 A | 8/2000 | Yamada et al. | |
| 6,501,678 B1* | 12/2002 | Lenssen | B82Y 25/00 |
| | | | 257/E27.005 |
| 7,126,327 B1 | 10/2006 | Busch | |
| 7,279,891 B1* | 10/2007 | Chilcote | B82Y 25/00 |
| | | | 324/207.21 |
| 7,592,803 B1 | 9/2009 | Guo et al. | |
| 7,834,616 B2 | 11/2010 | Stolfus et al. | |
| 7,915,886 B2 | 3/2011 | Stolfus et al. | |
| 2003/0102860 A1* | 6/2003 | Haji-Sheikh | G01D 5/145 |
| | | | 324/174 |
| 2003/0128028 A1* | 7/2003 | Jordil | G01B 7/02 |
| | | | 33/708 |
| 2008/0180089 A1 | 7/2008 | Stolfus et al. | |
| 2008/0180090 A1 | 7/2008 | Stolfus et al. | |
| 2011/0187354 A1* | 8/2011 | Zieren | G01D 5/147 |
| | | | 324/207.21 |
| 2012/0025808 A1* | 2/2012 | Granig | G01D 5/145 |
| | | | 324/202 |
| 2012/0139535 A1* | 6/2012 | Watanabe | G01R 33/07 |
| | | | 324/252 |
| 2015/0260546 A1* | 9/2015 | Hirota | G01D 5/14 |
| | | | 324/207.21 |
| 2016/0238635 A1* | 8/2016 | Zimmer | G01R 33/0017 |
| 2018/0299518 A1* | 10/2018 | Granig | G01R 33/093 |

OTHER PUBLICATIONS

Honeywell International Inc.; European Search Report; 16190758.9-1568; dated Feb. 15, 2017; 7 pages.
Europe Patent Application No. 16190758.9, Extended European Search Report, dated May 29, 2017, 15 pages.

* cited by examiner

AMR SPEED AND DIRECTION SENSOR FOR USE WITH MAGNETIC TARGETS

CROSS-REFERENCE TO RELATED APPLICATIONS

The present application claims priority to U.S. Provisional Patent Application Ser. No. 62/234,432 filed on Sep. 29, 2015 and entitled "AMR SPEED AND DIRECTION SENSOR FOR USE WITH MAGNETIC TARGETS," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Magnetic sensing systems are used in a wide variety of applications including, for example, determining the speed and direction of an object such as a rotating shaft. There are various methods of constructing the magnetic sensors of a magnetic sensing system. For example, a magnetic sensing system could comprise two separate magnetic sensors and a target (typically a structure having magnetic poles) that are arranged so that each of the two magnetic sensors produces an output signal as the target rotates or moves with respect to the magnetic sensors.

The two magnetic sensors may be spaced at a predetermined distance from one another so as to create a phase shift between their output signals. This phase shift can allow a designer (i) to use these output signals from the sensors to produce a higher resolution speed signal so that speed changes can be detected more quickly and (ii) to use the lead and lag information between the output signals from the two sensors in order to determine direction of rotation or movement of the target.

The phase shift between the outputs of two magnetic sensors is dependent on the spacing between the magnetic sensors and the spacing between the features of the rotating or moving target. Frequently, the target is a magnet, such as a ring magnet, with a plurality of evenly spaced magnetic poles. The magnetic sensors are usually contained in separate packages, which make it very difficult for the magnetic sensors to be arranged in a manner so that their output signals meet specified phase shift requirements. The magnetic sensors must be very accurately manufactured and/or they must be dynamically adjusted so that their output signals meet the specified phase shift requirements. Otherwise, errors in the phase shift will lead to a miscalculation of the speed of the target and, if the phase error is large enough to allow the output signals to cross, to a miscalculation of the direction of the movement of the target.

Magnetic sensors are sometimes provided on the same integrated circuit and are spaced a certain distance apart. However, although this spacing may be good for one particular pole spacing, it will not be correct for another. One solution is to fabricate an integrated circuit for each different ring magnet. However, making a new integrated circuit for every new spacing is expensive.

SUMMARY

In an embodiment, a movement sensor comprises a multi-pole ring magnet, a semiconductor substrate, a first magnetic sensor formed on the semiconductor substrate, and a second magnetic sensor formed on the semiconductor. The first magnetic sensor is configured to produce a first output signal in response to movement of the multi-pole ring magnet, and a centroid of the first magnetic sensor and a centroid of the second magnetic sensor are separate and radially aligned on the semiconductor substrate relative to the multi-pole ring magnet. The second magnetic sensor is arranged at a predetermined angle with respect to the first magnetic sensor, and the second magnetic sensor is configured to produce a second output signal in response to the movement of the multi-pole ring magnet. The predetermined angle is between 0° and 90° exclusive, and the predetermined angle is configured to produce a difference in phase between the first and second output signals in response to the movement of the multi-pole ring magnet. The first magnetic sensor can have a length or width in the range of from about 100 microns to about 400 microns. The first magnetic sensor can comprise a first magnetoresistive sensor, and the second magnetic sensor can comprise a second magnetoresistive sensor. The first magnetic sensor can comprise first and second magnetic sensing elements connected so as to form a first bridge, and the first bridge can be configured to produce the first output signal in response to movement of the multi-pole magnet. The second magnetic sensor can comprise third and fourth magnetic sensing elements connected so as to form a second bridge, and the second bridge can be configured to produce the second output signal in response to movement of the multi-pole magnet. The first magnetic sensor can comprise first, second, third, and fourth magnetic sensing elements connected so as to form a first Wheatstone bridge, and the second magnetic sensor can comprise fifth, sixth, seventh, and eighth magnetic sensing elements connected so as to form a second Wheatstone bridge. The movement sensor can also include one or more series resistors disposed in series with a source connector or an output connector of the first Wheatstone bridge or the second Wheatstone bridge. At least one of the one or more series resistors can comprise a negative temperature coefficient resistor. The first, second, third, fourth, fifth, sixth, seventh, and eight magnetic sensing elements can comprise magnetoresistors. The first magnetic sensor and the second magnetic sensor can be co-planar. The first magnetic sensor can comprise a first magnetoresistor formed as a first serpentine sensor having long first portions interconnected by relatively shorter first portions, a second magnetoresistor formed as a second serpentine sensor having long second portions interconnected by relatively shorter second portions, a third magnetoresistor formed as a third serpentine sensor having long third portions interconnected by relatively shorter third portions, and a fourth magnetoresistor formed as a fourth serpentine sensor having long fourth portions interconnected by relatively shorter fourth portions. The long first and third portions can be parallel to one another, and the long second and fourth portions can be parallel to one another. Imaginary axes parallel to the long first and third portions can be perpendicular to imaginary axes parallel to the long second and fourth portions. The second magnetic sensor can comprise a fifth magnetoresistor formed as a fifth serpentine sensor having long fifth portions interconnected by relatively shorter fifth portions, a sixth magnetoresistor formed as a sixth serpentine sensor having long sixth portions interconnected by relatively shorter sixth portions, a seventh magnetoresistor formed as a seventh serpentine sensor having long seventh portions interconnected by relatively shorter seventh portions, and an eighth magnetoresistor formed as an eighth serpentine sensor having long eighth portions interconnected by relatively shorter eighth portions. The long fifth and seventh portions can be parallel to one another, the long sixth and eighth portions can be parallel to one another, and imaginary axes parallel to the long fifth and seventh portions can be perpendicular to imaginary axes parallel to the long sixth and eighth portions. The imaginary axis parallel to the long fifth portions can be at a 45° angle with respect to the imaginary axes parallel to the long first and second portions, the imaginary axis parallel to the long sixth portions can be at a 45° angle with respect to the imaginary axes parallel to the long second and third portions, the imaginary axis parallel to the long seventh portions can be at a 45° angle with respect to the imaginary axes parallel to the long third and fourth portions, and the imaginary axis parallel to the long eighth portions can be at a 45° angle with respect to the imaginary axes parallel to the long first and fourth portions. The first magnetoresistor, the second magnetoresistor, the third magnetoresistor, and the fourth magnetoresistor can be concentric to each other, and the fifth magnetoresistor, the sixth magnetoresistor, the seventh magnetoresistor, and the eighth magnetoresistor can be concentric to each other. The first serpentine sensor and the third serpentine sensor can be topologically between 1) the fifth and sixth serpentine sensors and 2) the seventh and eight serpentine sensors. The predetermined angle can be about 45°. The predetermined angle can comprise an angle to produce a 90° difference between the first and second output signals. The multi-pole magnet can comprise a linear magnet having more than two poles.

A movement sensor comprises a multi-pole linear magnet, a semiconductor substrate, a first magnetic sensor formed on the semiconductor substrate, and a second magnetic sensor formed on the semiconductor. The first magnetic sensor is configured to produce a first output signal in response to movement of the multi-pole linear magnet, and a centroid of the first magnetic sensor and a centroid of the second magnetic sensor are separate and aligned on the semiconductor substrate along a line that is perpendicular to a surface of the multi-pole linear magnet. The second magnetic sensor is arranged at a predetermined angle with respect to the first magnetic sensor, and the second magnetic sensor is configured to produce a second output signal in response to the movement of the multi-pole linear magnet. The predetermined angle is configured to produce a difference in phase between the first and second output signals in response to the movement of the multi-pole ring magnet. The first magnetic sensor can have a length or width in the range of from about 100 microns to about 400 microns. The first magnetic sensor can comprise first, second, third, and fourth magnetic sensing elements connected so as to form a first Wheatstone bridge, and the second magnetic sensor can comprise fifth, sixth, seventh, and eighth magnetic sensing elements connected so as to form a second Wheatstone bridge. The movement sensor can also include one or more series resistors disposed in series with a source connector or an output connector of the first Wheatstone bridge or the second Wheatstone bridge. At least one of the one or more series resistors can comprise a negative temperature coefficient resistor. The first magnetic sensor and the second magnetic sensor can be co-planar.

A movement sensor comprises a multi-pole magnet, a semiconductor substrate, a first magnetic sensor formed on the semiconductor substrate, one or more series resistors disposed in series with a source connector or an output connector of the first Wheatstone bridge, and a second magnetic sensor formed on the semiconductor substrate. The first magnetic sensor comprises a first magnetoresistor, a second magnetoresistor, a third magnetoresistor, and a fourth magnetoresistor, and the first magnetoresistor, the second magnetoresistor, the third magnetoresistor, and the fourth magnetoresistor are arranged to form a first Wheatstone bridge. The second magnetic sensor produces a second output signal in response to movement of the multi-pole magnet. The first magnetic sensor and the second magnetic sensor can be configured on the semiconductor substrate to be subjected to a substantially uniform magnetic field. At least one of the one or more series resistors can comprise a negative temperature coefficient resistor. First and second magnetic sensors can be configured on the semiconductor substrate to produce a 90° phase difference between the first and second output signals. The multi-pole magnet can comprise a multi-pole ring magnet or a multi-pole linear magnet. The first magnetic sensor can have a length or width in the range of from about 150 microns to about 300 microns. The first magnetic sensor and the second magnetic sensor can have a combined width or length on the semiconductor substrate of between about 100 microns and about 400 microns.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
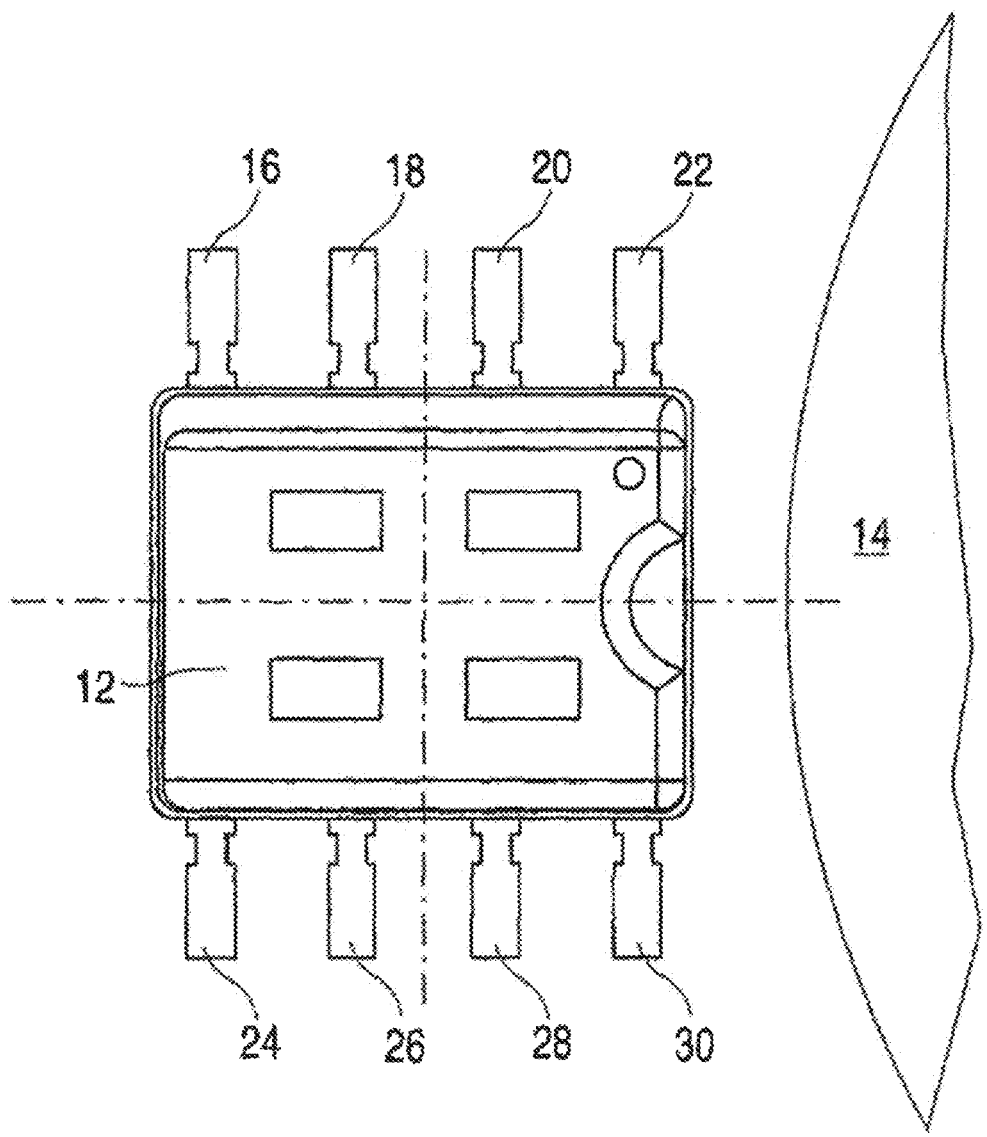
FIG. 1 illustrates an embodiment of a target wheel and a magnetic sensor package mounted with respect to the target wheel.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or approximately" or the like, when used with a number, may mean that specific number, or alternatively, a range in proximity to the specific number, as understood by persons of skill in the art field; and If the specification states a component or feature "may," "can," "could." "should." "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Disclosed herein are magnetic sensors such as those that are useful in the detection of the speed and/or direction of an object such as a rotating shaft. A speed and direction sensor can include two magnetic sensors, which can each comprise magnetoresistors. The orientation of each set of magnetoresistors in each sensor can be offset in angle to provide a phase difference in the output signal when subjected to a moving magnetic field. The magnetoresistors disclosed herein are significantly smaller than previous elements in magnetic sensors. For example, the magnetoresistors may be about ¼$^{th}$ the size of prior magnetoresistors (e.g., in a range less than 400 microns in width and/or length). The small size of the resulting sensors may have a number of advantages. Specifically, the small size of the sensors may allow the two magnetic sensors to be aligned along the radial direction of a ring magnet target. The two elements may then be subjected to a substantially uniform magnetic field as a result of the alignment and the small size of the sensors. This may provide a signal having less noise than in other magnetic sensors.

Due to the small size of the magnetic sensors, the resistance in the magnetoresistor elements may be less than in prior magnetic sensors. In order to limit the power consumption of the sensors, one or more series resistors can be placed in the circuits on the inlet or outlet of the circuits. For example, when four magnetoresistors are arranged in a Wheatstone bridge, one or more series resistors can be placed in series with the inlet voltage supply or the outlet ground connection. This may allow the magnetic sensors to operate with a reduced power consumption relative to a circuit without the series resistors. Further, the at least one of the series resistors may be a negative temperature coefficient resistor. The use of the negative temperature coefficient resistor may allow for temperature compensation of the overall circuit. For example, the negative temperature coefficient resistor may at least partially balance the increased resistance from the magnetoresistor elements to allow for operation of the device over a wide temperature range. These and other advantages are described in more detail in the description that follows.

As shown in FIG. 1, a sensor package 12 is positioned in proximity to a target 14, such as a wheel, so that the magnetic sensors contained in the sensor package 12 can be used to sense movement of the target 14. As disclosed below, this movement as sensed by the magnetic sensors in the sensor package 12 can then be used, as desired, to indicate speed and/or direction of movement or rotation of the target 14.

The sensor package 12 has various connectors 16, 18, 20, 22, 24, 26, 28, and 30. For example, the connector 16 may be used as a ground connection, the connectors 20 and 26 may be used as the output of one of the magnetic sensors contained in the sensor package 12, the connectors 22 and 24 may be used as the output of the other of the magnetic sensors contained in the sensor package 12, and the connector 30 may be used for a source connection. In this configuration, the connectors 18 and 28 are not used and may be omitted as desired. Alternatively, the connectors 18 and 28 may be used for any desired purposes in other configurations.

Figure 2:
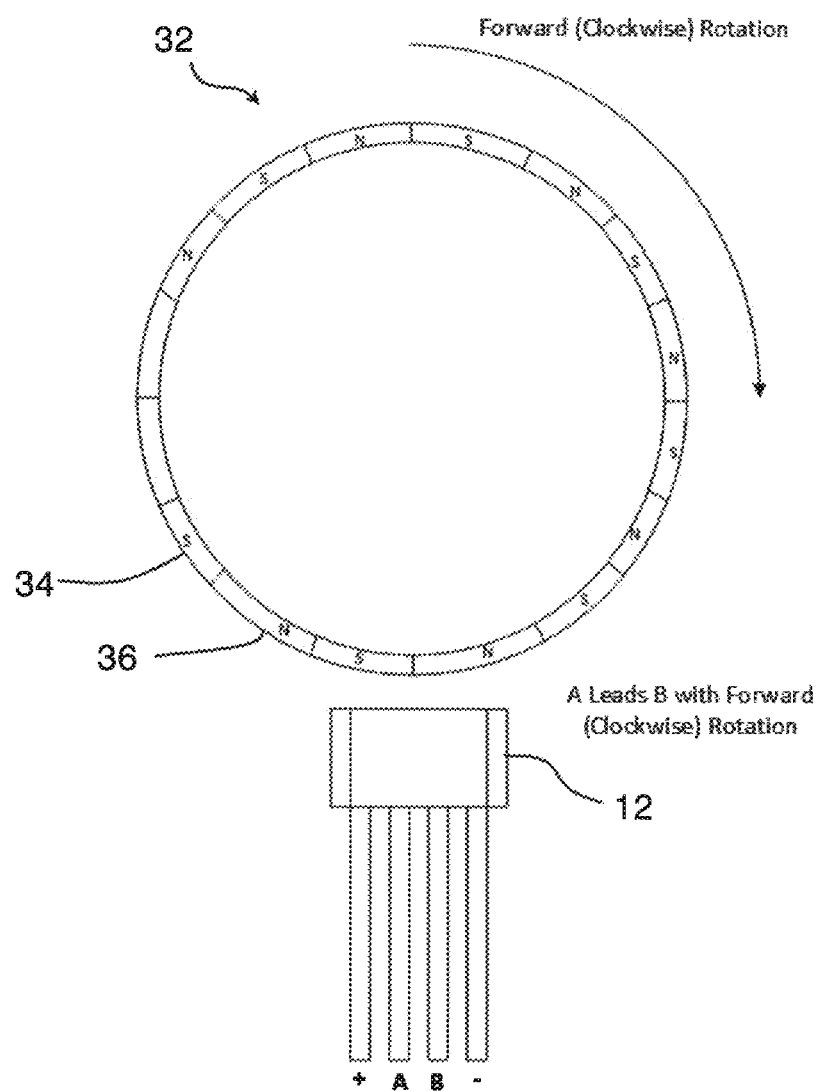
FIG. 2 illustrates an embodiment of a target wheel adjacent a sensor package.

An example of the target is shown in FIG. 2. The target as illustrated in FIG. 2 is a multi-pole ring magnet 32. A first plurality of poles 34 are evenly spaced around the multi-pole ring magnet 32 and are separated by a second plurality of poles 36. The poles 34, for example, may be South poles, and the poles 36, for example, may be North poles. There will always be a south pole for every north pole and vice versa. However, other targets, such as a gear target, may be used in connection with the present invention.

Figure 3A:
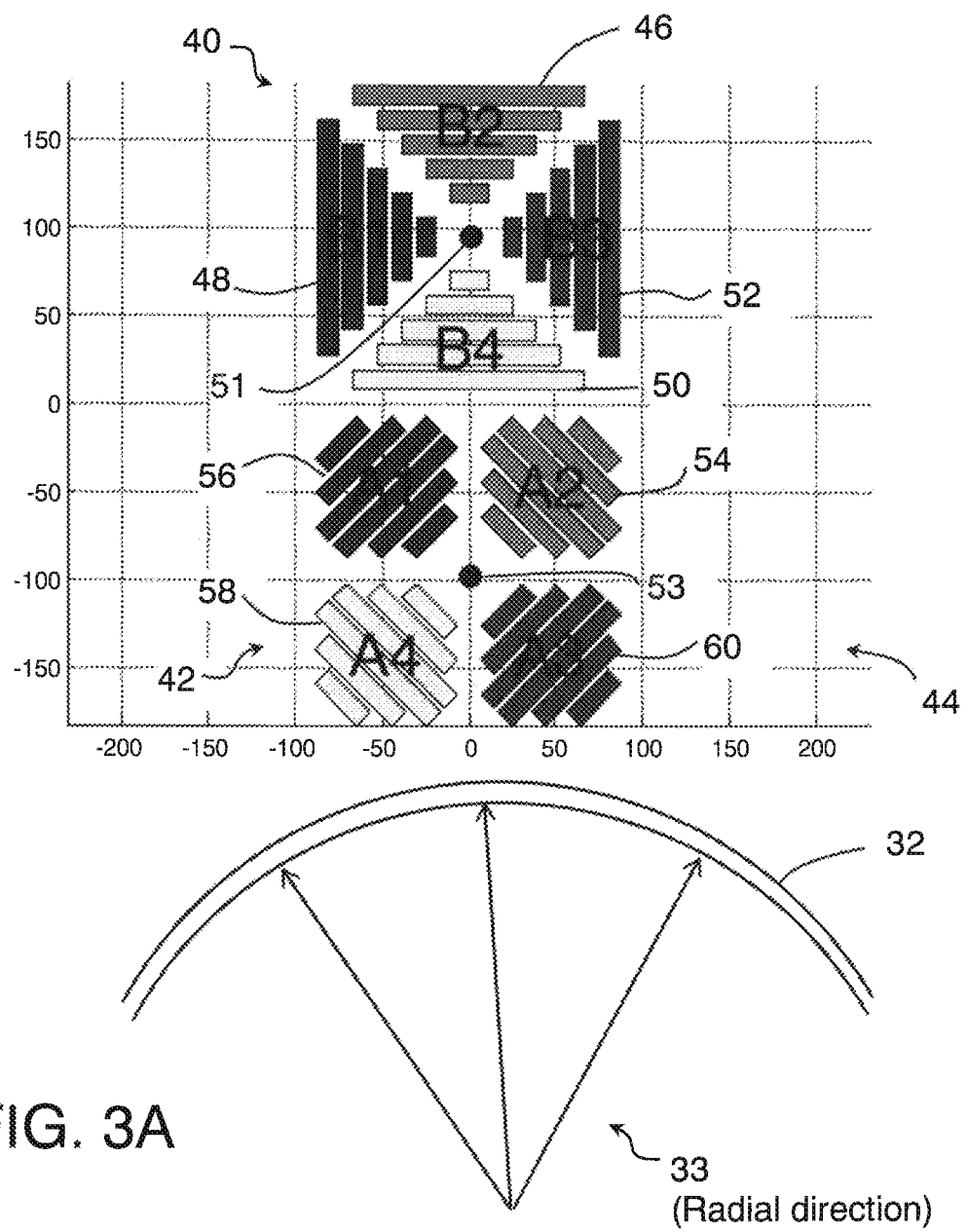
FIG. 3A illustrates an embodiment of a topology of two magnetic sensors that are formed as bridges A and B.

FIG. 3A shows two magnetic sensors 40 and 42 that can be contained in the sensor package. The two magnetic sensors 42 and 40 can be formed as bridges A and B, respectively, on a semiconductor substrate 44 using standard integrated circuit fabrication techniques such that the bridges A and B are topologically adjacent each other and are rotated by 45 degrees with respect to one another as shown in FIG. 3A. A centroid 51 can be defined for bridge A that represents the center of mass of the magnetoresistive elements 46, 48, 50, 52. Similarly, a centroid 53 can be defined for bridge B that represents the center of mass of the magnetoresistive elements 54, 56, 58, 60. While illustrated in FIG. 3A, the centroids 51, 53 are shown for purposes of illustration only and are not present in the sensors. The bridges A and B can be substantially radially aligned with a center of the target 32 (e.g., along radius 33) along the substrate 44 so that the bridges A and B are in alignment with the magnetic field produced by the target 32. The resulting configuration results in the centroid 51, 53 of each bridge A and B, respectively, being separate and radially aligned with the center of the target 32.

The magnetic sensor 40 includes four magnetoresistors 46, 48, 50, and 52, and the magnetic sensor 42 includes four magnetoresistors 54, 56, 58, and 60. As described in more detail below, the magnetic sensors 40 and 42 can each be arranged as a Wheatstone bridge.

Although the magnetoresistors 46, 48, 50, 52, 54, 56, 58, and 60 may be formed according to desired topology, the magnetoresistors 46, 48, 50, 52, 54, 56, 58, and 60, in the embodiment shown in FIG. 3A, are formed as serpentine sensors each having parallel elongated portions that can be joined at their ends by relatively short portions to form the serpentine arrangements shown in FIG. 3A.

The elongated portions of the magnetoresistor 46 are formed parallel to a first axis that is perpendicular to a second axis that is parallel to the elongated portions of the magnetoresistor 48, the second axis that is parallel to the elongated portions of the magnetoresistor 48 is perpendicular to a third axis that is parallel to the elongated portions of the magnetoresistor 50, the third axis that is parallel to the elongated portions of the magnetoresistor 50 is perpendicular to a fourth axis that is parallel to the elongated portions of the magnetoresistor 52, and the fourth axis that is parallel to elongated portions of the magnetoresistor 52 is perpendicular to the first axis that is parallel to the elongated portions of the magnetoresistor 46.

Similarly, the elongated portions of the magnetoresistor 54 are formed along a fifth axis that is perpendicular to a sixth axis that is parallel to the elongated portions of the magnetoresistor 56, the sixth axis that is parallel to the elongated portions of the magnetoresistor 56 is perpendicular to a seventh axis that is parallel to the elongated portions of the magnetoresistor 58, the seventh axis that is parallel to the elongated portions of the magnetoresistor 58 is perpendicular to an eighth axis that is parallel to the elongated portions of the magnetoresistor 60, and the eighth axis that is parallel to the elongated portions of the magnetoresistor 60 is perpendicular to fifth axis that is parallel to the elongated portions of the magnetoresistor 54.

In an embodiment, the first, second, third, and fourth axes of the magnetoresistors 54, 56, 58, and 60 are offset at an angle of 45 degrees with respect to the fifth, sixth, seventh, and eighth axes of adjacent ones of the magnetoresistors 46, 48, 50, and 52.

The magnetoresistors 46, 48, 50, 52, 54, 56, 58, and 60 can be arranged to form a relatively compact arrangement. A relatively small size of the magnetoresistors 46, 48, 50, 52, 54, 56, 58, and 60, and the corresponding bridges A and B formed by the magnetoresistors 46, 48, 50, 52, 54, 56, 58, and 60 can allow the bridges A and B to be present within a more uniform magnetic field. In general, the exposure of the bridges A and B to a more uniform magnetic field may provide a sharper signal with less noise for the detection of the speed and/or direction of travel or rotation of the target.

In an embodiment, the bridges may have a width and/or length between about 100 microns and about 400 microns, or between about 150 microns and about 300 microns. Each individual magnetoresistor may have a length and/or width between about 50 microns to about 150 microns. In some embodiments, the magnetoresistors 46, 48, 50, 52, 54, 56, 58, and 60 as formed on the semiconductor substrate 44 may be coplanar.

In an embodiment, the two bridges A and B can be placed in close proximity so that the overall size of the sensor package can be maintained as a compact design. In an embodiment, the bridges A and B can be concentric to themselves without being concentric to each other. For example, a bridge may have an overall size around 150 microns by 300 microns. In an embodiment, the dimension aligned with the radius of the target may be between about 100 to about 300 microns. Since the magnetic field tends to be uniform in a radial alignment, the two bridges A and B as shown in FIG. 3A can be aligned along the radial direction. Such small sizes and arrangement of the bridges A and B can allow for the formation of a compact bridge and sensor package.

Figure 3B:
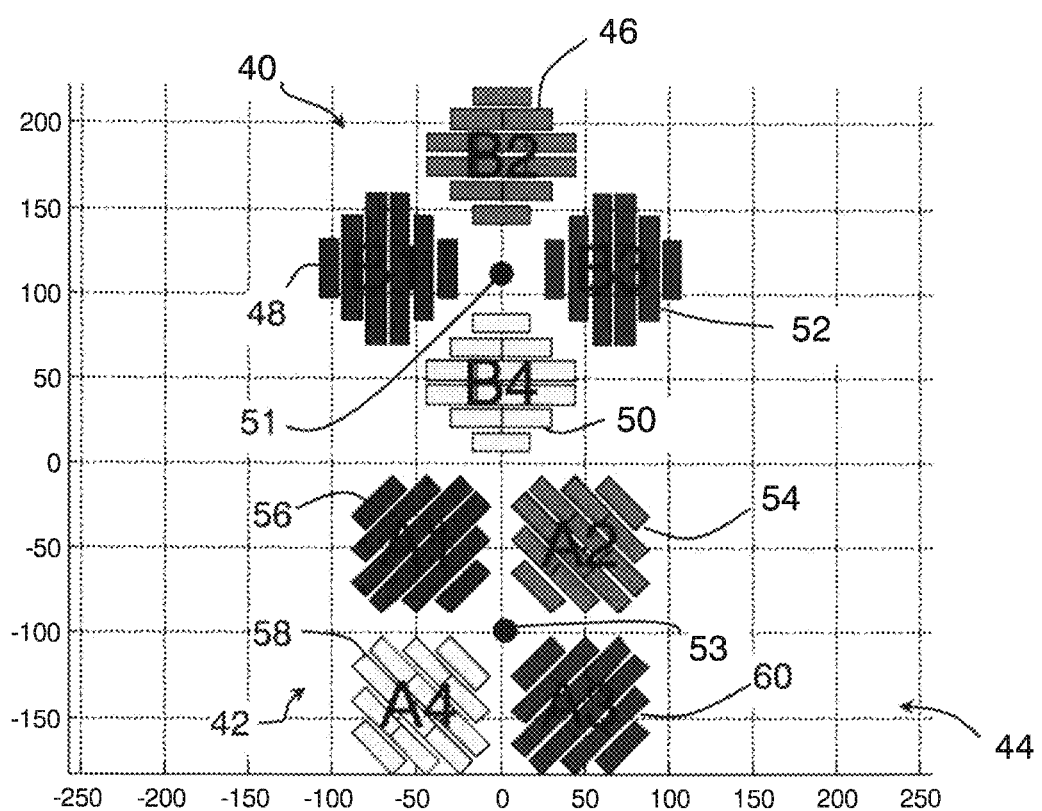
FIG. 3B illustrates another embodiment of a topology of two magnetic sensors that are formed as bridges A and B.

In some embodiments, the magnetoresistors 46, 48, 50, 52, 54, 56, 58, and 60 can be arranged in different configurations while still being configured as bridges A and B. The relative size of the overall sensor package can be maintained in the same ranges as described with respect to FIG. 3A while having different configurations. As shown in FIG. 3B, the magnetoresistors 46, 48, 50, 52 in bridge B can be the same or similar in length and design to the magnetoresistors 54, 56, 58, 60 in bridge A. The relative orientation of the magnetoresistors 46, 48, 50, 52, 54, 56, 58, and 60 within each bridge A and B, and between each bridge A and B are the same or similar to those shown in FIG. 3A. As with the configuration of FIG. 3A, the bridges A and B can be aligned adjacent to each other, and in some embodiments, the bridges A and B can be aligned in the radial direction with respect to the target. As with the bridges A and B illustrated in FIG. 3A, the centroid 51, 53 of each bridge A and B, respectively, are separate and radially aligned with respect to the center of the target 32.

Figure 3C:
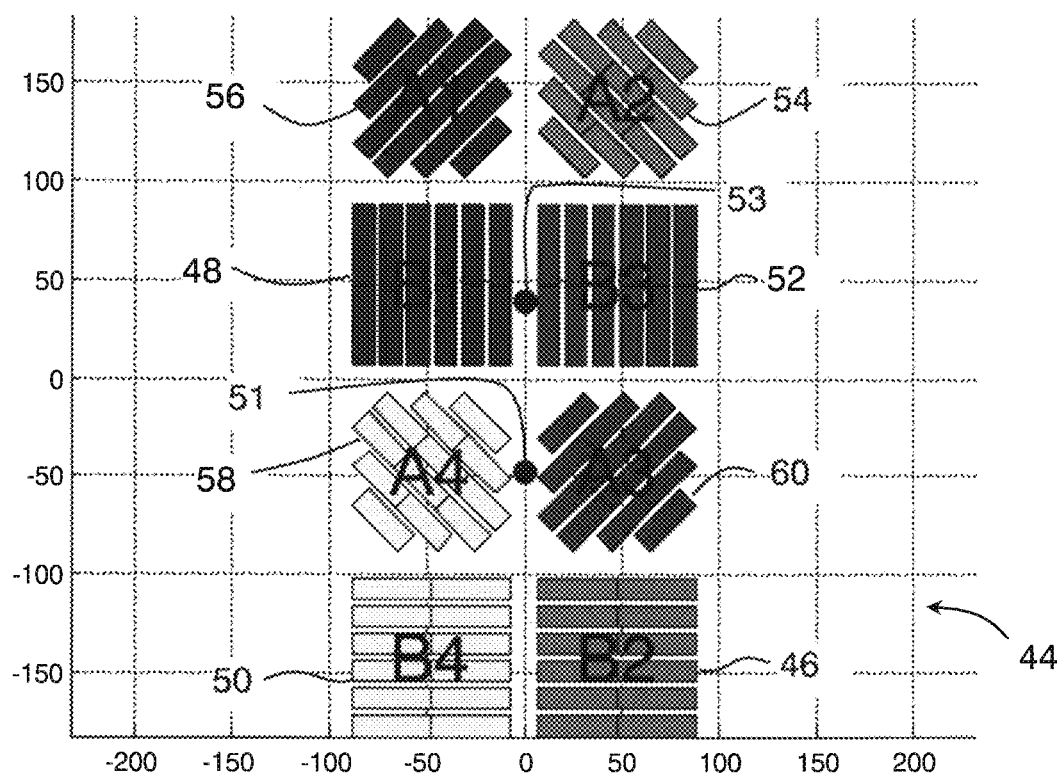
FIG. 3C illustrates still another embodiment of a topology of two magnetic sensors that are formed as bridges A and B.

As shown in FIG. 3C, the magnetoresistors 46, 48, 50, 52 in bridge B can be intertwined with the magnetoresistors 54, 56, 58, 60 in bridge A. The relative orientation of the magnetoresistors 46, 48, 50, 52, 54, 56, 58, and 60 within each bridge A and B, and between each bridge A and B are the same or similar to those shown in FIG. 3A. In this embodiment, the magnetoresistors 48 and 52 of bridge B can be disposed between the magnetoresistors 56, 54 and magnetoresistors 58, 60 of bridge A. Similarly, the magnetoresistors 58, 60 of bridge A can be disposed between the magnetoresistors 48, 52 and magnetoresistors 50, 46 of bridge B. In this embodiment, the two bridges can be intertwined in order to expose both bridges A and B to approximately the same magnetic field. When combined with the relatively small size of the bridges and sensor package, the sensor may have a reduced noise and improved resolution of the resulting signal.

While the magnetoresistors 46, 48, 50, 52 in bridge B can be intertwined with the magnetoresistors 54, 56, 58, 60 in bridge A, the centroid 53 of bridge B and the centroid 51 of bridge A are still separate (e.g., not located at the same point) and radially aligned with respect to the target.

Figure 4:
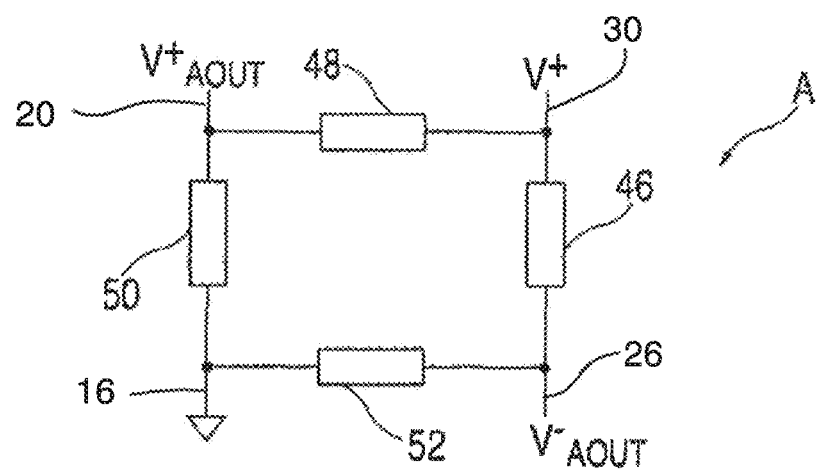
FIG. 4 illustrates the bridge A electrically.

As described above, the bridges A and B can be arranged as Wheatstone bridges. FIG. 4 illustrates a circuit diagram for the bridge configuration of bridge A. In this embodiment, the source (V+) connector 30 is connected to one end of the magnetoresistors 46 and 48, and the ground connector 16 is connected to one end of the magnetoresistors 50 and 52. The other ends of the magnetoresistors 48 and 50 are connected together and to the bridge A output connector 20, and the other ends of the magnetoresistors 46 and 52 are connected together and to the bridge A output connector 26.

Figure 5:
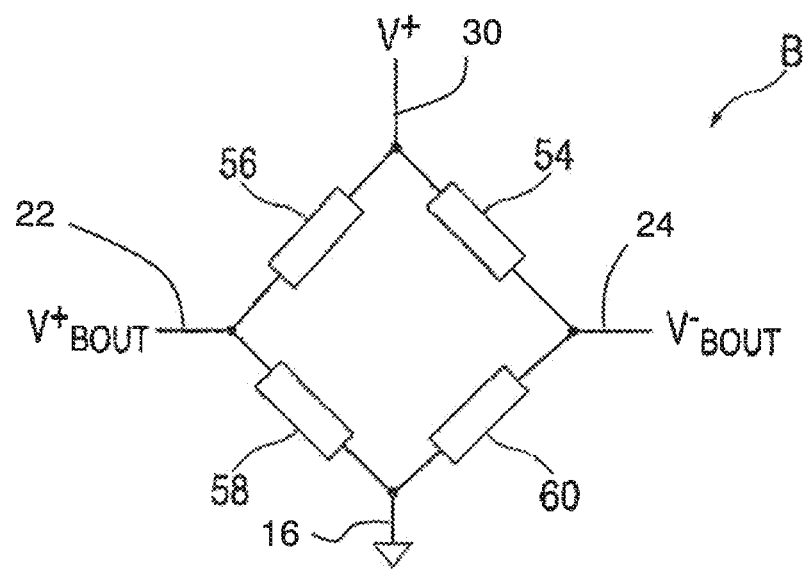
FIG. 5 illustrates the bridge B electrically.

FIG. 5 illustrates a circuit diagram for the bridge configuration of bridge B. The source (V+) connector 30 is connected to one end of the magnetoresistors 54 and 56, and the ground connector 16 is connected to one end of the magnetoresistors 58 and 60. The other ends of the magnetoresistors 56 and 58 are connected together and to the bridge B output connector 22, and the other ends of the magnetoresistors 54 and 60 are connected together and to the bridge B output connector 24.

Figure 6:
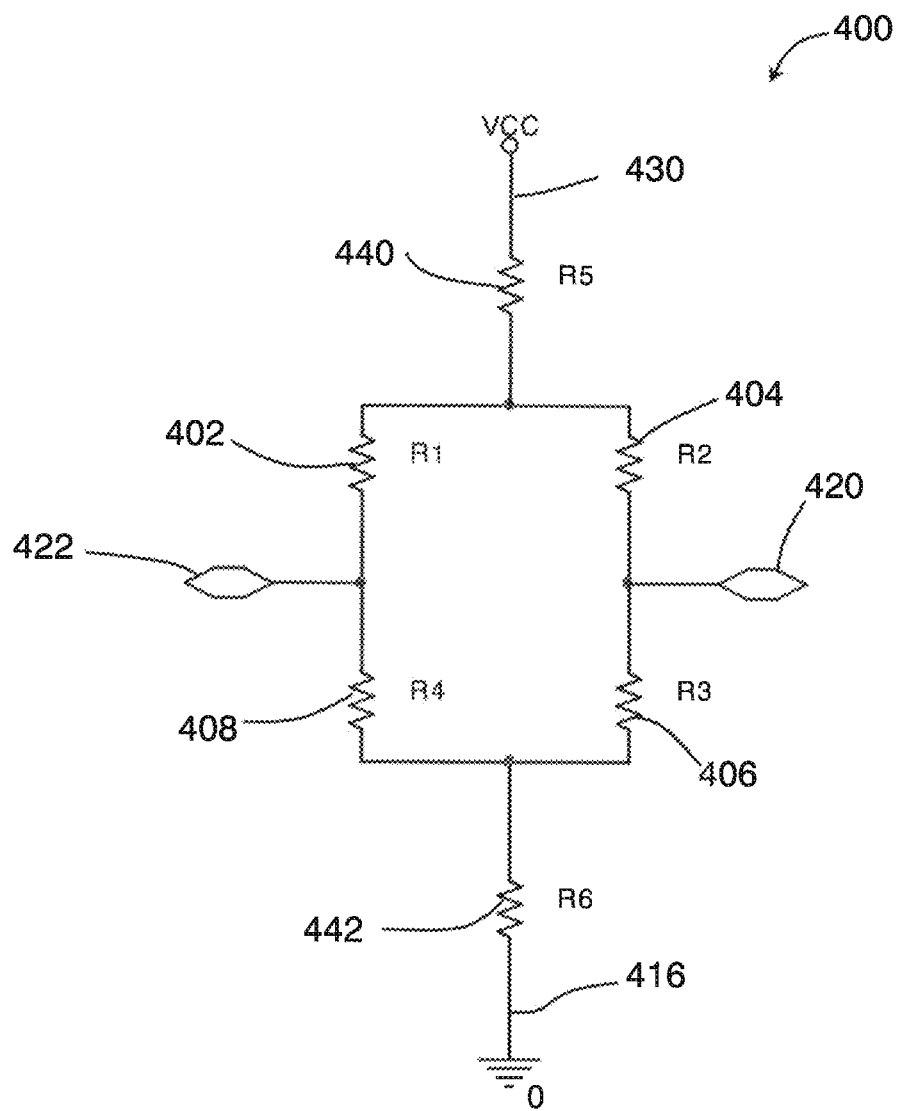
FIG. 6 illustrates an embodiment of a bridge design comprising series resistors.

FIG. 6 illustrates a circuit diagram of a Wheatstone bridge 400 that can be used with bridge A or bridge B. In this embodiment, the resistors 402, 404, 406, and 408 are arranged in a Wheatstone bridge configuration. The resistors 402, 404, 406, 408 can comprise magnetoresistors including any of those described with respect to the bridge A or bridge B designs. For example, the resistors 402, 404, 406, 408 can comprise resistors 48, 46, 52, and 50 of bridge A, respectively. Similarly, the resistors 402, 404, 406, 408 can comprise resistors 56, 54, 60, and 58 of bridge B, respectively. As shown in FIG. 6, the source (V+) connector 430 can be connected to one end of the magnetoresistors 402 and 404, and the ground connector 416 can be connected to one end of the magnetoresistors 406 and 408. The other ends of the magnetoresistors 402 and 408 are connected together and to the bridge 400 output connector 422, and the other ends of the magnetoresistors 404 and 406 are connected together and to the bridge 400 output connector 420.

As shown in FIG. 6, the main difference between the bridge designs of FIG. 4 and FIG. 5 and the bridge design of FIG. 6 is the inclusion of two series resistors 440, 442 that can serve to limit the current consumption of the bridge. The first resistor 440 can be electrically connected between the source connector 430 and one end of the magnetoresistors 402 and 404. The second resistor 442 can be electrically connected between the ground connector 416 and one end of the magnetoresistors 406 and 408. Due to the small size of the magnetoresistors 46, 48, 50, 52, 54, 56, 58, and 60 used in the bridges, the resistance obtained from the magnetoresistors themselves may result in a large current consumption for the sensor. One or both of the series resistors 440, 442 can be used to limit the overall current consumption for the device. While two series resistors 440, 442 are shown in FIG. 6, it will be appreciated that a single series resistor 440, or 442 can be used in the bridge 400 with similar results, where the total resistance when a single series resistor is used can be the same or similar to the total resistance for two series resistors when two series resistors 440, 442 are used. in some embodiments, more than two series resistors can be used in the bridge design.

In some embodiments, one or more of the series resistors 440, 442 can comprise negative temperature coefficient resistors. In general, the magnetoresistors 46, 48, 50, 52, 54, 56, 58, and 60 can be formed from materials having a positive temperature coefficient with respect to resistance so that the resistance of these elements increases with increasing temperature. This effect can limit the useful temperature range of the device. In order to compensate for the temperature effects, one or more of the series resistors can comprise a material having a negative temperature coefficient so that the resistance decreases with increasing temperature. In an embodiment, the resistance and negative temperature coefficient of the resistive material can be selected to balance the increase in resistance with increasing temperature effects in the magnetoresistors 46, 48, 50, 52, 54, 56, 58, and 60. If a plurality of series resistors comprise negative temperature coefficient resistors, the material selection may be the same or different, and the resistors may have the same or different resistances in order to balance the positive temperature coefficient resistance effects of the magnetoresistors 46, 48, 50, 52, 54, 56, 58, and 60.

Figure 7A:
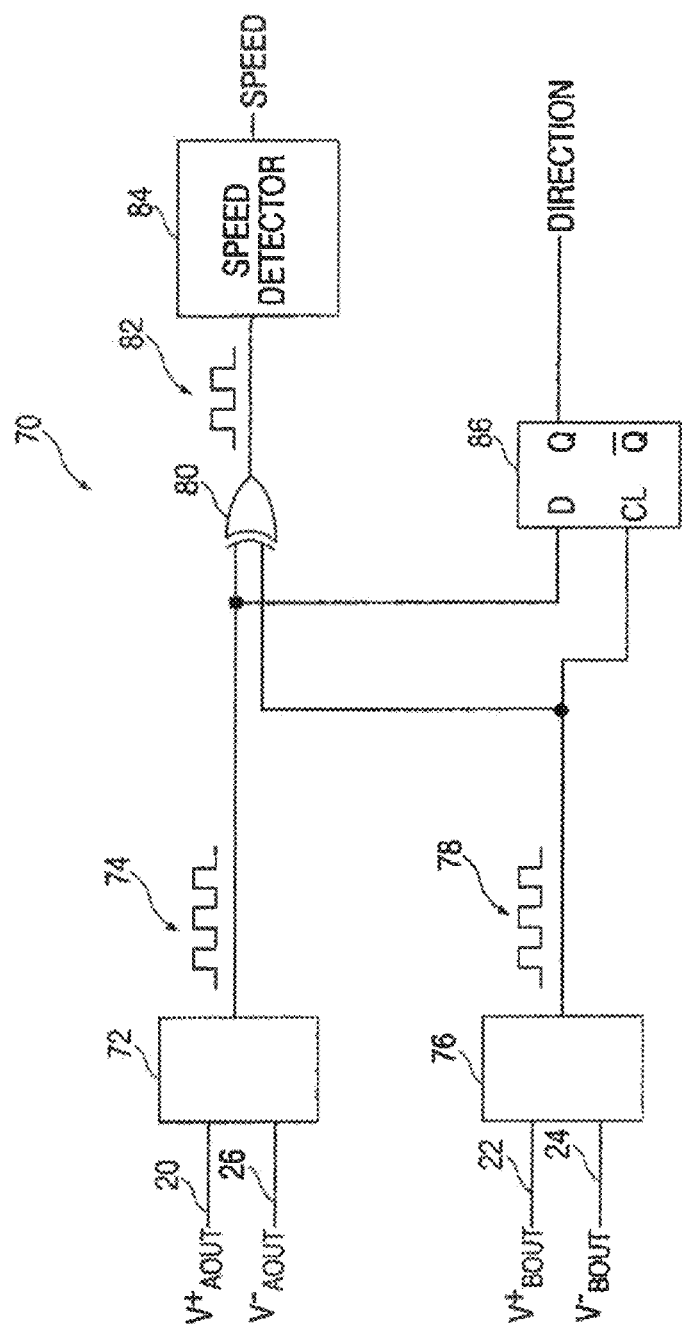
FIG. 7A illustrates an embodiment of a circuit that processes the output signals of two magnetic sensors.

FIG. 7A illustrates an example of a circuit 70 that receives the outputs from the bridges A and B and uses these outputs to produce a speed signal and/or a direction signal that indicates the speed and/or direction of movement of the target. The circuit 70 includes a first signal conditioner 72 that is connected to connectors 20 and 26 in order to receive the outputs from the bridge A. The first signal conditioner 72 may include, for example, buffers, amplifiers, switches, and/or such other apparatus as are suitable for providing a square wave output signal 74 having a frequency dependent upon the speed of the target 14 and the number of poles on the target 14.

The circuit 70 further includes a second signal conditioner 76 that is connected to connectors 22 and 24 in order to receive the outputs from the bridge B. The second signal conditioner 76 may include, for example, buffers, amplifiers, switches, and/or such other apparatus as are suitable for providing a square wave output signal 78 having a frequency dependent upon the speed of the target and the number of poles on the target.

Figure 7B:
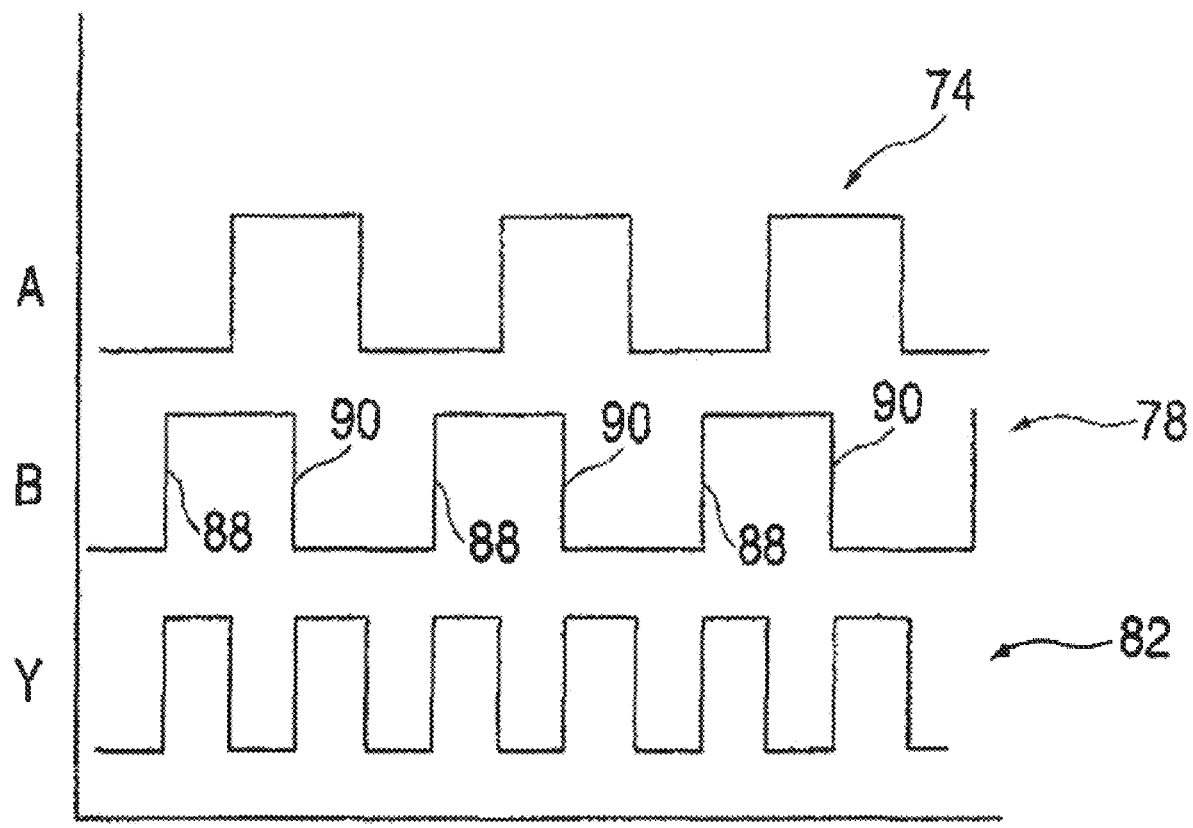
FIG. 7B illustrates exemplary waveforms corresponding to the sensor outputs from the signal processing circuit of FIG. 7A and an optional combined output signal useful in determining speed.

Because the bridges A and B are rotated by 45 degrees with respect to one another, the square wave output signal 74 is shifted in phase by 90 degrees with respect to the square wave output signal 78. This phase shift is shown in FIG. 7B. As can be seen from FIG. 7B, because the bridges A and B are accurately rotated by 45 degree with respect to one another due to the inherent accuracy of integrated circuit fabrication processing, and because the two bridges A and B are placed adjacent each other and/or intertwined to some degree so that they essentially occupy the same space on the semiconductor substrate, the phase is very accurately centered at 90 degrees of phase shift. This effect is further enhanced by the small size of the bridges A and B and the corresponding ability to be subjected to a more uniform magnetic field than larger bridge and magnetoresistor element designs. This phase shift also will be independent of the magnet pole size over the typical range of poles sizes commonly used in ring magnet sensing. Because the phase shift is set by the relative rotation of the bridges A and B during the integrated circuit fabrication process, tight manufacturing tolerances or adjustments may not be needed to control the phase shift.

As further shown in FIG. 7A, the square wave output signals 74 and 78 are combined by an EXCLUSIVE OR 80 so as to produce a square wave output signal 82. The relationship between the square wave output signals 74, 78, and 82 is shown in FIG. 7B. A speed detector 84 uses the square wave output signal 82 in order to determine the speed of the target and provides a speed output indicating this speed. As can be seen from FIG. 7A, the use of the EXCLUSIVE OR 80 doubles the frequency of the output signal as compared to the square wave output signal 74 or the square wave output signal 78 and, therefore, doubles the resolution of the speed indicating signal provided by the speed detector 84 based on only one of the bridges A and B.

The speed detector 84 can determine the speed of the target from the square wave output signal 82 in any of a variety of ways. For example, knowing the number of pulses required for the target to move through a predetermined angle, the speed detector 84 can determine the amount of the time that is required for the target to move through this predetermined angle and can use this angle and time information to determine speed. Alternatively, the speed detector 84 can determine the frequency of the square wave output signal 82 and can perform a look up that correlates frequency with speed for a particular form of the target. As will be understood by those skilled in the art, there are many other ways for determining the speed of the target from the square wave output signal 82.

Additionally or alternatively, the square wave output signals 74 and 78 can also be used to determine the direction of movement of the target. One manner of determining the direction of movement of the target 14 is shown in FIG. 7A. In this case, the square wave output signal 74 is supplied to the D input of a D flip-flop 86, and the square wave output signal 78 is supplied to the clock input of the D flip-flop 86. The Q output will be at a high state when the target is moving in one direction, and the Q output will be at a low state when the target is moving in the other direction. Thus, the state of the Q output indicates the direction of movement of the target.

That is, when the target moves in a first direction, the square wave output signals 74 and 78 enter the corresponding D and clock inputs of the D flip-flop 86 in a particular fashion, say from left to right as viewed in FIG. 7B. When the square wave output signals 74 and 78 enter the D and clock inputs of the D flip-flop 86 from left to right as viewed in FIG. 7B, then each rising edge 88 of the square wave output signal 78 enters the clock input of the D flip-flop when the square wave output signal 74 is low. Accordingly, the Q output of the D flip-flop 86 is at a low state, thus indicating the first direction of movement of the target.

However, when the target moves in the second or opposite direction, the square wave output signals 74 and 78 enter the corresponding D and clock inputs of the D flip-flop 86 in the opposite fashion, say from right to left as viewed in FIG. 7B. When the square wave output signals 74 and 78 enter the D and clock inputs of the D flip-flop 86 from right to left as shown in FIG. 7B, then each rising edge 90 of the square wave output signal 78 enters the clock input of the D flip-flop when the square wave output signal 74 is high. Accordingly, the Q output of the D flip-flop is at a high state, thus indicating the second or opposite direction of movement of the target.

Each of the magnetoresistors (e.g., magnetoresistors 46, 48, 50, 52, 54, 56, 58, and 60 of FIGS. 3A-3C), for example, may be a corresponding Anisotropic MagnetoResistive (AMR) sensor. Such sensors are non-polarity sensitive, so a complete magnetic signal cycle (roughly equivalent to a full sine wave) is achieved for each ring magnet pole. However, some magnetic sensors such as Hall effect sensors are polarity sensitive and need two ring magnet poles (or one pole-pair) to achieve a complete magnetic signal cycle. So double the resolution can be achieved by selecting a magnetoresistor sensor.

As described above, the two bridges forming the magnetic sensors can occupy the same area on the semiconductor substrate and may be fabricated on the semiconductor substrate using standard integrated circuit fabrication techniques. Bridges A and B formed by the magnetic sensors can be rotated 45 degrees with respect to one another such that one bridge signal is naturally shifted 90 degrees out of phase with respect to other bridge signal. This arrangement produces four times the resolution of a typical Hall effect sensor and twice the resolution of a single magnetoresistor sensor.

Another advantage of the dual sensors shown herein is that the phase is very accurately centered on 90 degrees of phase shift because the magnetoresistor bridges A and B occupy approximately the same space on the semiconductor substrate and are very accurately rotated with respect to one another due to the inherent accuracy of the integrated circuit fabrication process. Due to the relatively small size of the bridge designs disclosed herein, the sensors may occupy less space on the semiconductor substrate and be exposed to a more uniform magnetic field than previous designs.

Also, still another advantage of the sensor package is that the sensor package requires no modification if it is used with different multi-pole ring magnets having different numbers of poles and/or pole sizes. Thus, the phase shift between the two bridge signals 74 and 78 is independent of the magnet pole size over the typical range of pole sizes commonly used in ring magnet sensing. Because the phase shift is set by the rotational orientation of the bridges A and B in the integrated circuit wafer process, no tight manufacturing tolerances and/or adjustments are needed to control the phase shift.

Figure 8:
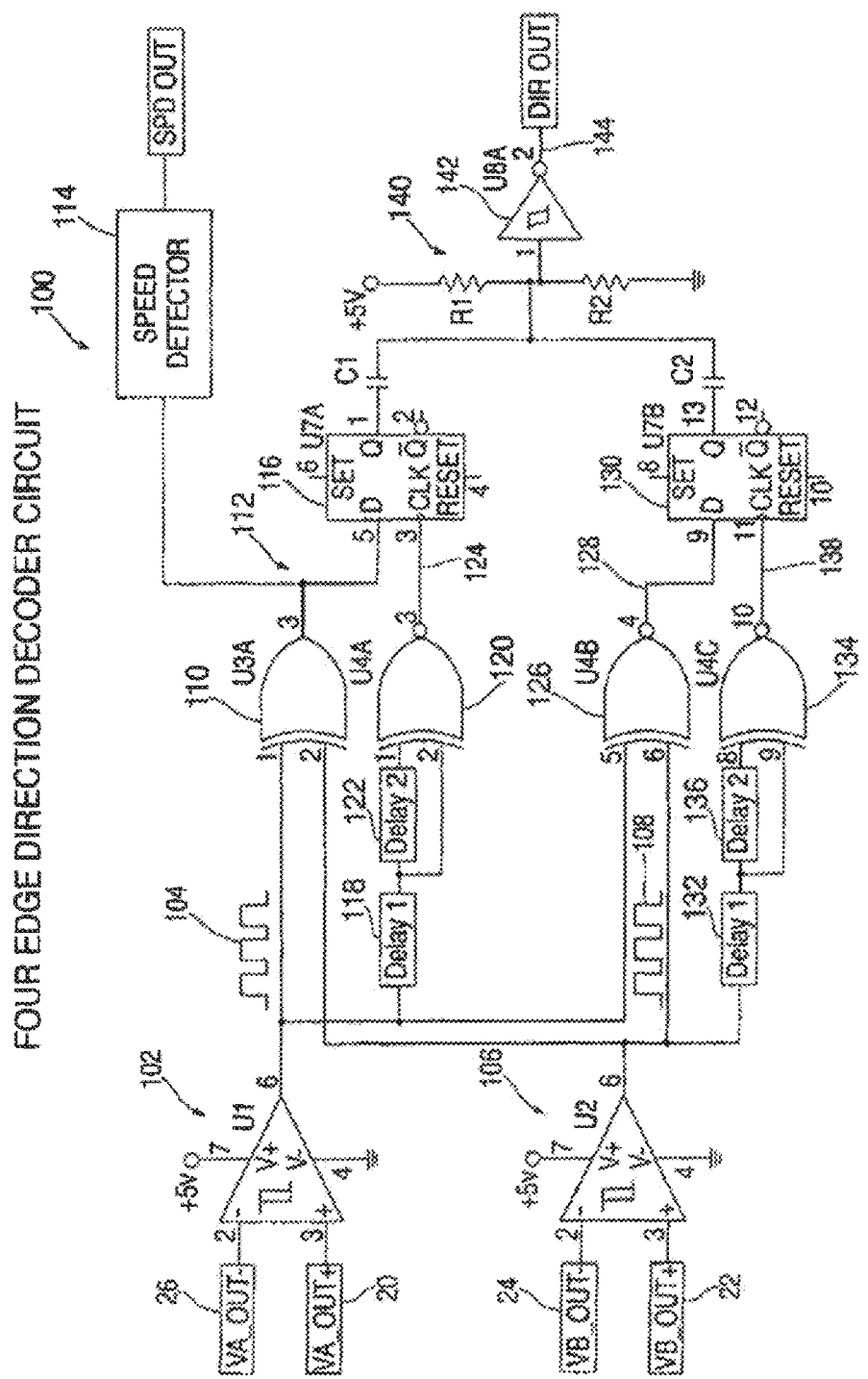
FIG. 8 illustrates another embodiment of a circuit that processes the output signals of the two magnetic sensors.

FIG. 8 illustrates an example of an alternative circuit 100 that receives the outputs from the bridges A and B and uses these outputs to produce a speed signal and/or a direction signal that indicates the speed and/or direction of movement of the target.

The circuit 100 includes a first signal conditioner 102 that is connected to connectors 20 and 26 in order to receive the outputs from the bridge A. The first signal conditioner 102 may include, for example, buffers, amplifiers, switches, and/or such other apparatus as are suitable for providing a square wave output signal 104 having a frequency dependent upon the speed of the target 14 and the number of poles on the target.

The circuit 100 further includes a second signal conditioner 106 that is connected to connectors 22 and 24 in order to receive the outputs from the bridge B. The second signal conditioner 106 may similarly include, for example, buffers, amplifiers, switches, and/or such other apparatus as are suitable for providing a square wave output signal 108 having a frequency dependent upon the speed of the target 14 and the number of poles on the target.

Figure 9:
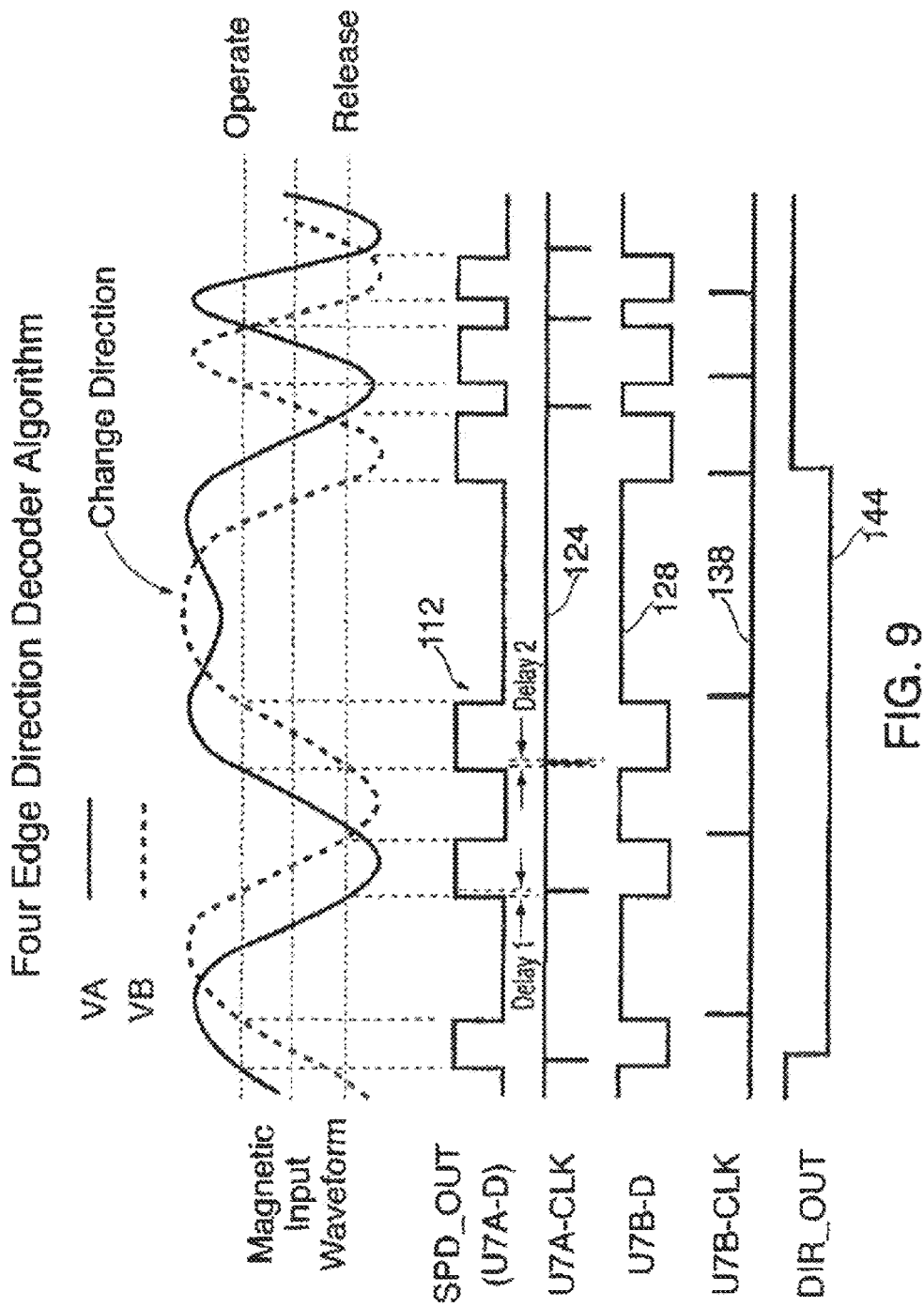
FIG. 9 illustrates exemplary waveforms corresponding to the sensor outputs from the signal processing circuit of FIG. 8 and an optional combined output signal useful in determining speed.

Because the bridges A and B are rotated by 45 degrees with respect to one another, the square wave output signal 104 is shifted in phase by 90 degrees with respect to the square wave output signal 108. This phase shift corresponds to the phase shift between the bridges A and B output magnetic waveforms as shown at the top of FIG. 9. As can be seen from FIG. 9, because the bridges A and B are accurately rotated by 45 degrees with respect to one another due to the inherent accuracy of integrated circuit fabrication processing, and because the two bridges A and B are placed adjacent to each other and/or are intertwined or overlap to some degree so that they essentially occupy the same space on the semiconductor substrate, the phase is very accurately centered at 90 degrees of phase shift. This phase shift also will be independent of the magnet pole size over the typical range of poles sizes commonly used in ring magnet sensing. Because the phase shift is set by the relative rotation of the bridges A and B during the integrated circuit fabrication process, no tight manufacturing tolerances or adjustments are required to control the phase shift.

As further shown in FIG. 8, the square wave output signals 104 and 108 are combined by an EXCLUSIVE OR 110 so as to produce a square wave output signal 112 shown in FIG. 9. A speed detector 114 uses the square wave output signal 112 in order to determine the speed of the target and provides a speed output indicating this speed. The speed detector 114 can determine the speed of the target 14 from the square wave output signal 112 in a manner similar to that used by the speed detector 84 of FIG. 7A

Additionally or alternatively, the square wave output signals 104 and 108 can also be used to determine the direction of movement of the target 14. In this case, the square wave output signal 112 is supplied to the D input of a D flip-flop 116. The square wave output signal 104 is also supplied to a delay 118, and the output of the delay 118 is connected directly to a first input of an EXCLUSIVE NOR 120 and indirectly through a delay 122 to a second input of the EXCLUSIVE NOR 120. The output of the EXCLUSIVE NOR 120 is provided as a signal 124 shown in FIG. 9 to the clock input of the D flip-flop 116.

The delay imposed by the delay 118 provides the necessary setup time (D to be settled before clock edge arrives) for the D flip-flop 116. The delay imposed by the delay 122 provides the minimum clock width for the D flip-flop 116.

The square wave output signals 104 and 108 are also combined by an EXCLUSIVE NOR 126 so as to produce a square wave output signal 128 shown in FIG. 9. The square wave output signal 128 is supplied to the D input of a D flip-flop 130. The square wave output signal 108 is also supplied to a delay 132, and the output of the delay 132 is connected directly to a first input of an EXCLUSIVE NOR 134 and indirectly through a delay 136 to a second input of the EXCLUSIVE NOR 134. The output of the EXCLUSIVE NOR 134 is provided as a signal 138 shown in FIG. 9 to the clock input of the D flip-flop 130.

The delay imposed by the delay 132 provides the necessary setup time (D to be settled before clock edge arrives) for the 3 flip-flop 130. The delay imposed by the delay 136 provides the minimum clock width for the D flip-flop 130.

The Q outputs of the D flip-flops 116 and 130 are capacitively OR's by a circuit 140 and the resulting pulse is inverted and held by an inverter 142 to provide a direction signal 144 shown in FIG. 9. The direction signal 144 is at a high state when the target is moving in one direction, and the direction signal 144 is at a low state when the target is moving in the other direction. The resistor and capacitor values in the circuit 140 are chosen to set the voltage midway between the hysteresis band (internal to the inverter 142 in this example). These resistor and capacitor values also set the minimum time that an additional direction change will be detected.

Circuits other than the circuits 70 and 100 can be used depending upon the specific application, including considerations of the type of output (e.g., speed, direction, speed and direction, etc.) needed.

Figure 10:
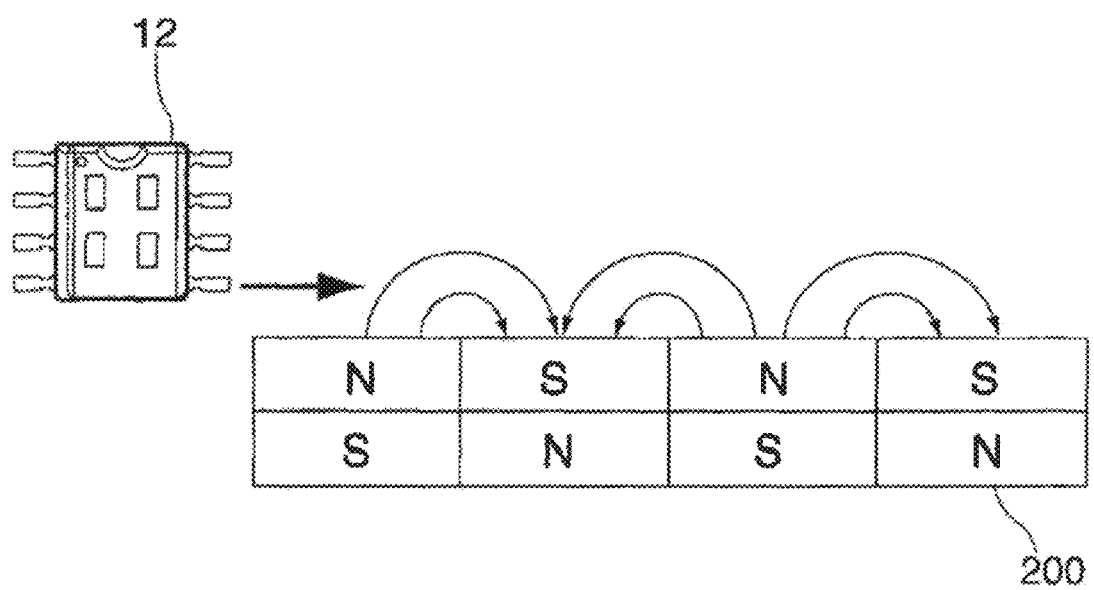
FIG. 10 illustrates an embodiment of a linear target.

Instead of using the multi-pole ring magnet 32 of FIG. 2, other multi-pole magnets such as a linear multi-pole magnet 200 shown in FIG. 10 could be used with the sensor package 12 to detect movement extent, rate, and/or direction. For example, the circuits shown in FIGS. 7A and 8 could be used in connection with the linear multi-pole magnet 200. When a linear multi-pole magnet 200 is used, the bridges A and B may be aligned in a direction perpendicular to a surface of the multi-pole magnet 200. In some embodiments, the centroids of each bridge A and B can be separate and aligned in a direction perpendicular to the surface of the multi-pole magnet 200. This orientation may allow the two bridges A and B to be subjected to the same magnetic field.

Figure 11:
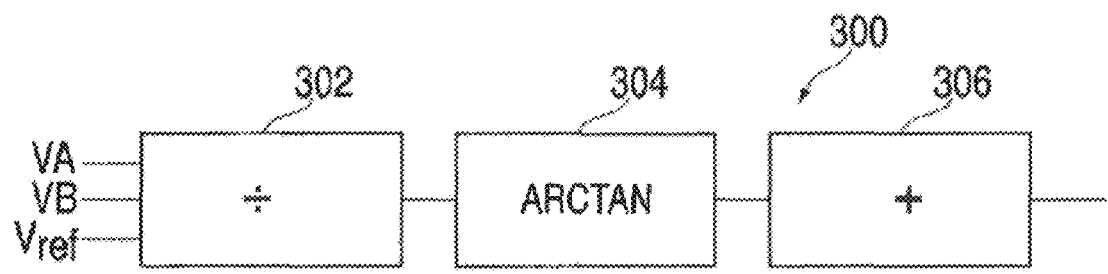
FIG. 11 illustrates an embodiment of an apparatus for forming a linear signal from the outputs of a magnetic sensor.

As shown in FIG. 11, an output signal converter 300 is provided in order to convert the outputs from two magnetic sensors to a linear signal such as a linear voltage ramp signal. The two magnetic sensors are interwoven on the same semiconductor substrate and are rotated with respect to one another by an amount sufficient to shift their outputs by 90 degree with respect to one another. These magnetic sensors, for example, may be in the form of bridges shown in FIGS. 4-6, and may be arranged on the same semiconductor substrate and rotated with respect to one another by 90 degrees as shown in FIGS. 3A-3C. The outputs from the two magnetic sensors, for convenience, may be designated as VA and VB, and are provided as two of the inputs to the output signal converter 300 shown in FIG. 11.

A third input representing the DC bias of the magnetic sensors is also provided to the output signal converter 300. This DC bias is designated $V_{ref}$ and is determined as $V_{ref} = V_{supply}/2$, wherein $V_{supply}$ is the voltage of the source connected to the connector 30.

The output signal converter 300 includes a divider 302 that subtracts the DC bias from VA and VB and then divides the result to produce the following quantity:

$$\frac{VA - V_{ref}}{VB - V_{ref}} \qquad \text{Eq. 1}$$

An arctangent calculator 304 calculates the arctangent of quantity (1) to produce the following quantity:

$$\arctan\left(\frac{VA - V_{ref}}{VB - V_{ref}}\right) \qquad \text{Eq. 2}$$

A summer 306 adds $V_{ref}$ to quantity (2) to produce $V_{ramp}$ according to the following equation:

$$V_{ramp} = \arctan\left(\frac{VA - V_{ref}}{VB - V_{ref}}\right) + V_{ref} \qquad \text{Eq. 3}$$

$V_{ramp}$, is an analog voltage ramp signal that can be used to provide an even higher resolution speed output that described previously herein. The linear ramp voltage $V_{ramp}$ may be used instead of, or in addition to, the signal 82 and/or 112 previously described.

This higher resolution can be important particularly because there is generally a physical limit to the number of magnet poles that can be applied in a given area of the target. This higher resolution can also be important when slow speeds of the target are to be detected.

Equation (3) can be refined to improve accuracy and/or linearity of the linear ramp voltage $V_{ramp}$ by determining a separate reference voltage for each of the magnetic sensors according to the following equation:

$$V_{ramp} = \arctan\left(\frac{VA - \left(\frac{VA_{max} + VA_{min}}{2}\right)}{VB - \left(\frac{VB_{max} + VB_{min}}{2}\right)}\right) + V_{ref} \qquad \text{Eq. 4}$$

$V_{ref}$ in equation (4) is still determined as ½ of the sensor or bridge supply voltage. Another refinement is to correct for gain error between the two signals VA and VB. In this case, a gain correction factor N that corrects for gain error is determined according to the following equation:

$$N = \frac{\left(\frac{VA_{max} - VA_{min}}{2}\right)}{\left(\frac{VB_{max} - VB_{min}}{2}\right)} \qquad \text{Eq. 5}$$

The gain correction factor N is then used in equation (4) to correct for gain error in accordance with the following equation:

$$V_{ramp} = \arctan\left(\frac{VA - \left(\frac{VA_{max} + VA_{min}}{2}\right)}{N\left(VB - \left(\frac{VB_{max} + VB_{min}}{2}\right)\right)}\right) + V_{ref} \quad \text{Eq. 6}$$

The refinements given by equations (4)-(6) make the sensor of FIG. 3 more accurate because these refinements compensate for errors caused by temperature, part-to-part tolerance variation, etc.

The output signal converter 300 may be in discrete components such as those shown in FIG. 11 or the output signal converter 300 may comprise a computer or other processor that makes the calculations described above. Alternatively, the output signal converter 300 may be an application specific integrated circuit (ASIC), a programmable field array, etc.

Figure 12:
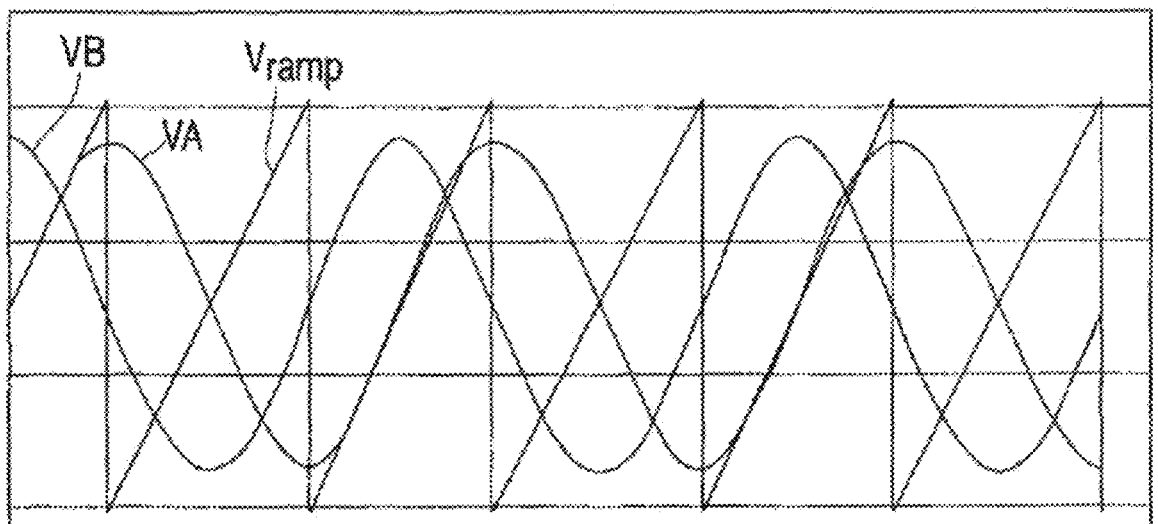
FIG. 12 illustrates waveforms relating to the apparatus of FIG. 11.

FIG. 12 illustrates the signals VA, VB, and $V_{ramp}$.

Figure 13:
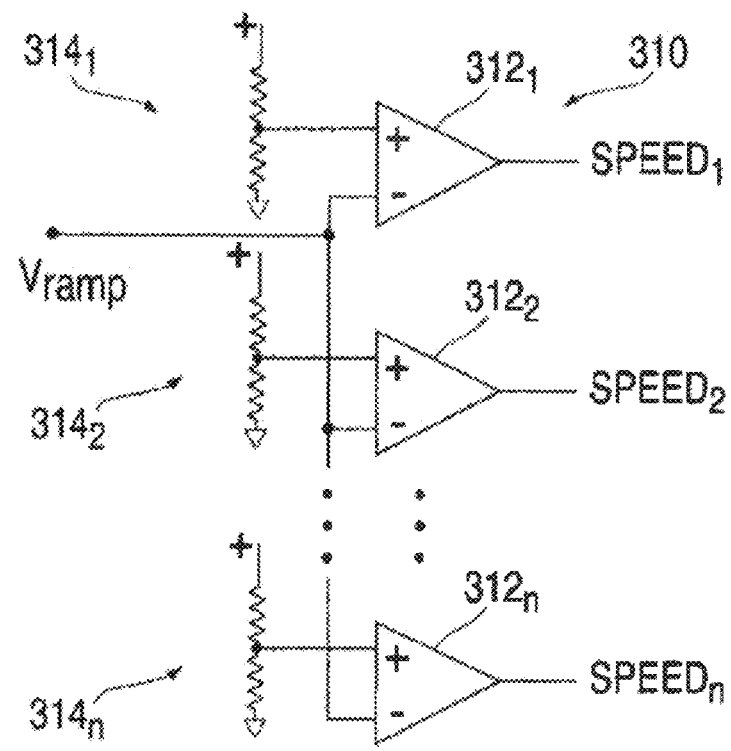
FIG. 13 illustrates one example of detecting speed from the linear output of the apparatus of FIG. 11.

As shown in FIG. 13, a speed detector 310 includes a plurality of comparators $312_1, 312_2, \ldots, 312_n$ each of which receives the linear ramp voltage $V_{ramp}$ and each having a different trip point set by a corresponding one of a plurality of threshold set circuits $314_1, 314_2, \ldots, 314_n$, where n can be any number depending on the desired number of trip points (i.e., resolution).

As the linear ramp voltage $V_{ramp}$ increases sufficiently to reach the lowest trip point, a corresponding one of the comparators $312_1, 312_2, \ldots, 312_n$ provides an output speed$_1$. As the linear ramp voltage $V_{ramp}$ increases to the next trip point, the one of the comparators $312_1, 312_2, \ldots, 312_n$ corresponding to this next trip point provides an output, speed$_2$. The two comparators $312_1, 312_2, \ldots, 312_n$ continue to trip to produce the outputs speed$_3$ through speed$_n$.

The elapsed time between the outputs speed$_1$, speed$_2$, speed$_3$, ..., speed$_n$ indicates the speed of the target, and the order in which the outputs speed$_1$, speed$_2$, speed$_3$, ..., speed$_n$ are produced indicates the direction of the target.

Figure 14:
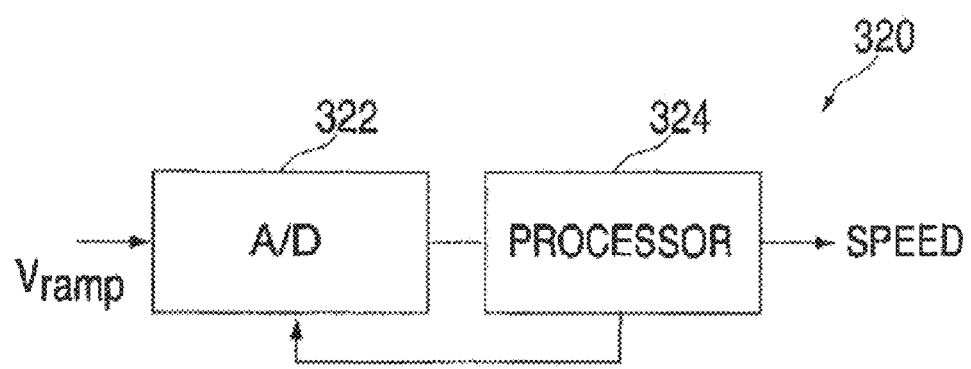
FIG. 14 illustrates another example of detecting speed from the linear output of the apparatus of FIG. 11.

As shown in FIG. 14, an alternative speed detector 320 includes an analog to digital converter 322 and a processor 324. The processor 324 computes speed of the target from the digital output of the analog to digital converter 322. For example, the processor 324 may determine the speed of the target from the slope of the linear ramp voltage $V_{ramp}$.

The direction of movement of the target can be determined from the sign of the slope of the linear ramp voltage $V_{ramp}$. For example, this slope can be determined by the processor 324.

The linear ramp voltage $V_{ramp}$ avoids the use of pole pieces that are too small and that cannot, therefore, provide sufficient magnetic field strength to be sensed. Also, use of the linear ramp voltage $V_{ramp}$ results in higher resolution.

Certain modifications of the present invention have been discussed above. Other modifications of the present invention will occur to those practicing in the art of the present invention. For example, the D flip-flop 86 is used to determine direction of movement of the target 14. However, other mechanisms can be used to determine direction of movement of the target 14.

Also, the magnetic sensor 40 is generally shown in the drawings and described above as a Wheatstone bridge comprising four sensing elements, and the magnetic sensor 42 is also generally shown in the drawings and described above as a Wheatstone bridge comprising four sensing elements. However, the magnetic sensors 40 and 42 may have other arrangements. For example, the magnetic sensor 40 may be a two element bridge comprising two sensing elements, and the magnetic sensor 42 may likewise be a two element bridge comprising two sensing elements.

Moreover, as described above, each of the magnetoresistors 46, 48, 50, 52, 54, 56, 58, and 60 may be a corresponding Anisotropic MagnetoResistive (AMR) sensor. However, other magnetoresistive elements may be used for the magnetoresistors 46, 48, 50, 52, 54, 56, 58, and 60. For example, a corresponding giant magnetoresistor (GMR) element may be used for each of the magnetoresistors 46, 48, 50, 52, 54, 56, 58, and 60.

In addition, one, two, or more sensors can be integrated on the semiconductor substrate 44. Indeed, in general, n sensors can be provided such that the elements (magnetoresistors) would occur every 90/n degrees. For one bridge having a total of four elements, the elements would be formed on the semiconductor substrate 44 every 90 (90/1, n=1) degrees. For two bridges having a total of eight elements, the elements would be formed on the substrate every 45 (90/2, n=2) degrees as in FIG. 3. For three bridges having a total of twelve elements, the elements would be formed on the substrate every 30 (90/3, n=3) degrees, and so on. Using two bridges instead of one, both direction information and increased resolution are gained. After two bridges, however, only increased resolution is gained.

Furthermore, the circuit 70 may be fabricated as an integrated circuit on the semiconductor substrate 44, or may be fabricated as an integrated circuit on a substrate that is separate from the semiconductor substrate 44, or may be fabricated as a discrete element circuit.

The sensors as described here are used to detect speed and direction of a target. They can also be used to detect the extent of movement of the target.

Also, if DC offset is not a concern, then the output signal converter 300 can calculate the linear ramp voltage $V_{ramp}$ simply according to the following equation:

$$V_{ramp} = \arctan\left(\frac{VA}{VB}\right) \quad \text{Eq. 7}$$

Having described various systems and methods herein, specific embodiments can include, but are not limited to:

In a first embodiment, a movement sensor comprises: a multi-pole ring magnet; a semiconductor substrate; a first magnetic sensor formed on the semiconductor substrate, wherein the first magnetic sensor is configured to produce a first output signal in response to movement of the multi-pole ring magnet; and a second magnetic sensor formed on the semiconductor substrate, wherein a centroid of the first magnetic sensor and a centroid of the second magnetic sensor are separate and radially aligned on the semiconductor substrate relative to the multi-pole ring magnet, wherein the second magnetic sensor is arranged at a predetermined angle with respect to the first magnetic sensor, wherein the second magnetic sensor is configured to produce a second output signal in response to the movement of the multi-pole ring magnet, wherein the predetermined angle is between 0° and 90° exclusive, and wherein the predetermined angle is configured to produce a difference in phase between the first and second output signals in response to the movement of the multi-pole ring magnet.

A second embodiment can include the movement sensor of the first embodiment, wherein the first magnetic sensor has a length or width in the range of from about 100 microns to about 400 microns.

A third embodiment can include the movement sensor of the first or second embodiment, wherein the first magnetic sensor comprises a first magnetoresistive sensor, and wherein the second magnetic sensor comprises a second magnetoresistive sensor.

A fourth embodiment can include the movement sensor of any of the first to third embodiments, wherein the first magnetic sensor comprises first and second magnetic sensing elements connected so as to form a first bridge, wherein the first bridge is configured to produce the first output signal in response to movement of the multi-pole magnet, wherein the second magnetic sensor comprises third and fourth magnetic sensing elements connected so as to form a second bridge, and wherein the second bridge is configured to produce the second output signal in response to movement of the multi-pole magnet.

A fifth embodiment can include the movement sensor of the first embodiment, wherein the first magnetic sensor comprises first, second, third, and fourth magnetic sensing elements connected so as to form a first Wheatstone bridge, and wherein the second magnetic sensor comprises fifth, sixth, seventh, and eighth magnetic sensing elements connected so as to form a second Wheatstone bridge.

A sixth embodiment can include the movement sensor of the fifth embodiment, further comprising one or more series resistors disposed in series with a source connector or an output connector of the first Wheatstone bridge or the second Wheatstone bridge.

A seventh embodiment can include the movement sensor of the sixth embodiment, wherein at least one of the one or more series resistors comprises a negative temperature coefficient resistor.

An eighth embodiment can include the movement sensor of any of the fifth to seventh embodiments, wherein the first, second, third, fourth, fifth, sixth, seventh, and eight magnetic sensing elements comprise magnetoresistors.

A ninth embodiment can include the movement sensor of any of the first to eighth embodiments, wherein the first magnetic sensor and the second magnetic sensor are co-planar.

A tenth embodiment can include the movement sensor of the first embodiment, wherein the first magnetic sensor comprises: a first magnetoresistor formed as a first serpentine sensor having long first portions interconnected by relatively shorter first portions; a second magnetoresistor formed as a second serpentine sensor having long second portions interconnected by relatively shorter second portions; a third magnetoresistor formed as a third serpentine sensor having long third portions interconnected by relatively shorter third portions; and, a fourth magnetoresistor formed as a fourth serpentine sensor having long fourth portions interconnected by relatively shorter fourth portions; wherein the long first and third portions are parallel to one another, wherein the long second and fourth portions are parallel to one another, and wherein imaginary axes parallel to the long first and third portions are perpendicular to imaginary axes parallel to the long second and fourth portions; and, wherein the second magnetic sensor comprises: a fifth magnetoresistor formed as a fifth serpentine sensor having long fifth portions interconnected by relatively shorter fifth portions; a sixth magnetoresistor formed as a sixth serpentine sensor having long sixth portions interconnected by relatively shorter sixth portions; a seventh magnetoresistor formed as a seventh serpentine sensor having long seventh portions interconnected by relatively shorter seventh portions; and, an eighth magnetoresistor formed as an eighth serpentine sensor having long eighth portions interconnected by relatively shorter eighth portions; wherein the long fifth and seventh portions are parallel to one another, wherein the long sixth and eighth portions are parallel to one another, wherein imaginary axes parallel to the long fifth and seventh portions are perpendicular to imaginary axes parallel to the long sixth and eighth portions, wherein the imaginary axis parallel to the long fifth portions is at a 45° angle with respect to the imaginary axes parallel to the long first and second portions, wherein the imaginary axis parallel to the long sixth portions is at a 45° angle with respect to the imaginary axes parallel to the long second and third portions, wherein the imaginary axis parallel to the long seventh portions is at a 45° angle with respect to the imaginary axes parallel to the long third and fourth portions, wherein the imaginary axis parallel to the long eighth portions is at a 45° angle with respect to the imaginary axes parallel to the long first and fourth portions.

An eleventh embodiment can include the movement sensor of the tenth embodiment, wherein the first magnetoresistor, the second magnetoresistor, the third magnetoresistor, and the fourth magnetoresistor are concentric to each other.

A twelfth embodiment can include the movement sensor of the tenth or eleventh embodiment, wherein the fifth magnetoresistor, the sixth magnetoresistor, the seventh magnetoresistor, and the eighth magnetoresistor are concentric to each other.

A thirteenth embodiment can include the movement sensor of any of the tenth to twelfth embodiments, wherein the first serpentine sensor and the third serpentine sensor are topologically between 1) the fifth and sixth serpentine sensors and 2) the seventh and eight serpentine sensors.

A fourteenth embodiment can include the movement sensor of any of the first to thirteenth embodiments, wherein the predetermined angle is about 45°.

A fifteenth embodiment can include the movement sensor of any of the first to fourteenth embodiments, wherein the predetermined angle comprises an angle to produce a 90° difference between the first and second output signals.

A sixteenth embodiment can include the movement sensor of any of the first to fifteenth embodiments, wherein the multi-pole magnet comprises a linear magnet having more than two poles.

In a seventeenth embodiment, a movement sensor comprises: a multi-pole linear magnet; a semiconductor substrate; a first magnetic sensor formed on the semiconductor substrate, wherein the first magnetic sensor is configured to produce a first output signal in response to movement of the multi-pole linear magnet; and a second magnetic sensor formed on the semiconductor substrate, wherein a centroid of the first magnetic sensor and a centroid of the second magnetic sensor are separate and aligned on the semiconductor substrate along a line that is perpendicular to a surface of the multi-pole linear magnet, wherein the second magnetic sensor is arranged at a predetermined angle with respect to the first magnetic sensor, wherein the second magnetic sensor is configured to produce a second output signal in response to the movement of the multi-pole linear magnet, and wherein the predetermined angle is configured to produce a difference in phase between the first and second output signals in response to the movement of the multi-pole linear magnet.

An eighteenth embodiment can include the movement sensor of the seventeenth embodiment, wherein the first magnetic sensor has a length or width in the range of from about 100 microns to about 400 microns.

A nineteenth embodiment can include the movement sensor of the seventeenth or eighteenth embodiment, wherein the first magnetic sensor comprises first, second, third, and fourth magnetic sensing elements connected so as to form a first Wheatstone bridge, and wherein the second magnetic sensor comprises fifth, sixth, seventh, and eighth magnetic sensing elements connected so as to form a second Wheatstone bridge.

A twentieth embodiment can include the movement sensor of the nineteenth embodiment, further comprising one or more series resistors disposed in series with a source connector or an output connector of the first Wheatstone bridge or the second Wheatstone bridge.

A twenty first embodiment can include the movement sensor of the twentieth embodiment, wherein at least one of the one or more series resistors comprises a negative temperature coefficient resistor.

A twenty second embodiment can include the movement sensor of any of the seventeenth to twenty first embodiments, wherein the first magnetic sensor and the second magnetic sensor are co-planar.

In a twenty third embodiment, a movement sensor comprises: a multi-pole magnet; a semiconductor substrate; a first magnetic sensor formed on the semiconductor substrate, wherein the first magnetic sensor comprises a first magnetoresistor, a second magnetoresistor, a third magnetoresistor, and a fourth magnetoresistor, wherein the first magnetoresistor, the second magnetoresistor, the third magnetoresistor, and the fourth magnetoresistor are arranged to form a first Wheatstone bridge; one or more series resistors disposed in series with a source connector or an output connector of the first Wheatstone bridge; and a second magnetic sensor formed on the semiconductor substrate, wherein the second magnetic sensor produces a second output signal in response to movement of the multi-pole magnet.

A twenty fourth embodiment can include the movement sensor of the twenty third embodiment, wherein the first magnetic sensor and the second magnetic sensor are configured on the semiconductor substrate to be subjected to a substantially uniform magnetic field.

A twenty fifth embodiment can include the movement sensor of the twenty third or twenty fourth embodiment, wherein at least one of the one or more series resistors comprises a negative temperature coefficient resistor.

A twenty sixth embodiment can include the movement sensor of any of the twenty third to twenty fifth embodiments, wherein first and second magnetic sensors are configured on the semiconductor substrate to produce a 90° phase difference between the first and second output signals.

A twenty seventh embodiment can include the movement sensor of any of the twenty third to twenty sixth embodiments, wherein the multi-pole magnet comprises a multi-pole ring magnet or a multi-pole linear magnet.

A twenty eighth embodiment can include the movement sensor of any of the twenty third to twenty seventh embodiments, wherein the first magnetic sensor has a length or width in the range of from about 150 microns to about 300 microns.

A twenty ninth embodiment can include the movement sensor of the twenty eighth embodiment, wherein the first magnetic sensor and the second magnetic sensor have a combined width or length on the semiconductor substrate of between about 100 microns and about 400 microns.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as comprises, includes, and having should be understood to provide support for narrower terms such as consisting of, consisting essentially of, and comprised substantially of. Use of the term "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A movement sensor comprising:
a multi-pole ring magnet;
a semiconductor substrate;
a first magnetic sensor formed on the semiconductor substrate, wherein the first magnetic sensor is configured to produce a first output signal in response to movement of the multi-pole ring magnet, and wherein the first magnetic sensor comprises: a first magnetoresistor, a second magnetoresistor, a third magnetoresistor, and a fourth magnetoresistor that are concentric to each other to define a first centroid representing a first center of mass associated with the first, second, third, and fourth magnetoresistors;
a second magnetic sensor formed on the semiconductor substrate and positioned directly adjacent to the first magnetic sensor, wherein the second magnetic sensor comprises: a fifth magnetoresistor, a sixth magnetoresistor, a seventh magnetoresistor, and an eighth magnetoresistor that are concentric to each other to define a second centroid representing a second center of mass associated with the fifth, sixth, seventh, and eighth magnetoresistors; and
a first resistor, wherein a first end of the first resistor is both directly connected to a first end of the first magnetoresistor and directly connected to a first end of the third magnetoresistor, wherein a second end of the first resistor is directly connected to a source connector, wherein the first resistor comprises a negative temperature coefficient material, and wherein the first magnetoresistor and the third magnetoresistor comprise a positive temperature coefficient material,
wherein:
the first magnetic sensor and the second magnetic sensor are radially aligned on the semiconductor substrate relative to the multi-pole ring magnet,
the second magnetic sensor is arranged at a predetermined angle with respect to the first magnetic sensor,
the second magnetic sensor is configured to produce a second output signal in response to the movement of the multi-pole ring magnet,
the predetermined angle is between 0° and 90° exclusive,
the predetermined angle is configured to produce a difference in phase between the first and second output signals in response to the movement of the multi-pole ring magnet,
the first, second, third, and fourth magnetoresistors are radially symmetric about the first centroid and the fifth, sixth, seventh, and eighth magnetoresistors are radially symmetric about the second centroid, and
the first centroid and the second centroid are disposed at spaced apart locations along a radius of the multi-pole ring magnet, the radius extending orthogonally from a rotational axis of the multi-pole ring magnet, such that the first and second magnetic sensors are not concentric to each other.

2. The movement sensor of claim 1, wherein the first magnetic sensor has a length or width in a range of from about 100 microns to about 400 microns.

3. The movement sensor of claim 1, wherein the first and second magnetoresistors are connected so as to form a first bridge, wherein the first bridge is configured to produce the first output signal in response to the movement of the multi-pole ring magnet, wherein the fifth and sixth magnetoresistors are connected so as to form a second bridge, and wherein the second bridge is configured to produce the second output signal in response to the movement of the multi-pole ring magnet.

4. The movement sensor of claim 1, wherein the first, second, third, and fourth magnetoresistors are connected so as to form a first Wheatstone bridge, and wherein the fifth, sixth, seventh, and eighth magnetoresistors are connected so as to form a second Wheatstone bridge.

5. The movement sensor of claim 1, wherein the first magnetic sensor and the second magnetic sensor are coplanar.

6. The movement sensor of claim 1, wherein:
the first magnetoresistor is formed as a first serpentine sensor having first segments;
the second magnetoresistor is formed as a second serpentine sensor having second segments;
the third magnetoresistor is formed as a third serpentine sensor having third segments;
the fourth magnetoresistor is formed as a fourth serpentine sensor having fourth segments;
the first and third segments are parallel to one another, the second and fourth segments are parallel to one another, and the first and third segments are perpendicular to the second and fourth segments;
the fifth magnetoresistor is formed as a fifth serpentine sensor having fifth segments;
the sixth magnetoresistor is formed as a sixth serpentine sensor having sixth segments;
the seventh magnetoresistor is formed as a seventh serpentine sensor having seventh segments;
the eighth magnetoresistor is formed as an eighth serpentine sensor having eighth segments;
the fifth and seventh segments are parallel to one another, the sixth and eighth segments are parallel to one another, and the fifth and seventh segments are perpendicular to the sixth and eighth segments, and
the fifth segments are arranged at a 45° angle with respect to the first and second segments, the sixth segments are arranged at a 45° angle with respect to the second and third segments, the seventh segments are arranged at a 45° angle with respect to the third and fourth segments, and the eighth segments are arranged at a 45° angle with respect to the first and fourth segments.

7. The movement sensor of claim 6, wherein the first serpentine sensor and the third serpentine sensor are topologically between 1) the fifth and sixth serpentine sensors and 2) the seventh and eighth serpentine sensors.

8. The movement sensor of claim 1, wherein the predetermined angle is 45°.

9. The movement sensor of claim 1 further comprising:
a second resistor, wherein a first end of the second resistor is both directly connected to a first end of the second magnetoresistor and directly connected to a first end of the fourth magnetoresistor in parallel, wherein a second end of the second resistor is directly connected to a first end of a ground connector.

10. The movement sensor of claim 1 further comprising:
a speed detection circuit configured to generate a speed output signal indicative of a relative speed between the multi-pole ring magnet and the semiconductor substrate in response to receiving the first output signal from the first magnetic sensor and the second output signal from the second magnetic sensor, wherein the speed detection circuit comprises an EXCLUSIVE OR operator.

11. A movement sensor comprising:
a multi-pole linear magnet;
a semiconductor substrate;
a first magnetic sensor formed on the semiconductor substrate, wherein the first magnetic sensor is configured to produce a first output signal in response to movement of the multi-pole linear magnet, and wherein the first magnetic sensor comprises: a first magnetoresistor, a second magnetoresistor, a third magnetoresistor, and a fourth magnetoresistor that are concentric to each other to define a first centroid representing a first center of mass associated with the first, second, third, and fourth magnetoresistors;
a second magnetic sensor formed on the semiconductor substrate and positioned directly adjacent to the first magnetic sensor, wherein the second magnetic sensor comprises: a fifth magnetoresistor, a sixth magnetoresistor, a seventh magnetoresistor, and an eighth magnetoresistor that are concentric to each other to define a second centroid representing a second center of mass associated with the fifth, sixth, seventh, and eighth magnetoresistors; and
a first resistor, wherein a first end of the first resistor is both directly connected to a first end of the first magnetoresistor and directly connected to a first end of the third magnetoresistor, wherein a second end of the first resistor is directly connected to a source connector, wherein the first resistor comprises a negative temperature coefficient material, and wherein the first magnetoresistor and the third magnetoresistor comprise a positive temperature coefficient material,
wherein:
the first magnetic sensor and the second magnetic sensor are aligned on the semiconductor substrate along a line that is perpendicular to a surface of the multi-pole linear magnet,
the second magnetic sensor is arranged at a predetermined angle with respect to the first magnetic sensor,
the second magnetic sensor is configured to produce a second output signal in response to the movement of the multi-pole linear magnet,
the predetermined angle is configured to produce a difference in phase between the first and second output signals in response to the movement of the multi-pole linear magnet,
the first, second, third, and fourth magnetoresistors are radially symmetric about the first centroid and the fifth, sixth, seventh, and eighth magnetoresistors are radially symmetric about the second centroid, and,
the first centroid and the second centroid are disposed at spaced apart locations along a lateral axis of the multi-pole linear magnet that is orthogonal to a longitudinal axis of the multi-pole linear magnet, such that the first and second magnetic sensors are not concentric to each other.

12. The movement sensor of claim 11, wherein the first, second, third, and fourth magnetoresistors are connected so as to form a first Wheatstone bridge, and wherein the fifth, sixth, seventh, and eighth magnetoresistors are connected so as to form a second Wheatstone bridge.

13. The movement sensor of claim 11, wherein the first magnetic sensor and the second magnetic sensor are co-planar.

14. A movement sensor comprising:
a multi-pole ring magnet;
a semiconductor substrate;
a first magnetic sensor formed on the semiconductor substrate, wherein the first magnetic sensor is configured to produce a first output signal in response to movement of the multi-pole ring magnet, wherein the first magnetic sensor comprises a first magnetoresistor, a second magnetoresistor, a third magnetoresistor, and a fourth magnetoresistor that are concentric to each other to define a first centroid representing a first center of mass associated with the first, second, third, and fourth magnetoresistors, wherein the first magnetoresistor, the second magnetoresistor, the third magnetoresistor, and the fourth magnetoresistor are arranged to form a first Wheatstone bridge;
a first resistor, wherein a first end of the first resistor is both directly connected to a first end of the first magnetoresistor and directly connected to a first end of the third magnetoresistor, wherein a second end of the first resistor is directly connected to a source connector, wherein the first resistor comprises a negative temperature coefficient material, and wherein the first magnetoresistor and the third magnetoresistor comprise a positive temperature coefficient material; and
a second magnetic sensor formed on the semiconductor substrate and positioned directly adjacent to the first magnetic sensor, wherein the second magnetic sensor produces a second output signal in response to the movement of the multi-pole ring magnet, wherein the second magnetic sensor comprises: a fifth magnetoresistor, a sixth magnetoresistor, a seventh magnetoresistor, and an eighth magnetoresistor that are concentric to each other to define a second centroid representing a second center of mass associated with the fifth, sixth, seventh, and eighth magnetoresistors,
wherein the first centroid and the second centroid are disposed at spaced apart locations along a radius of the multi-pole ring magnet, the radius extending orthogonally from a rotational axis of the multi-pole ring magnet, such that the first and second magnetic sensors are not concentric to each other, and
wherein the first, second, third, and fourth magnetoresistors are radially symmetric about the first centroid and the fifth, sixth, seventh, and eighth magnetoresistors are radially symmetric about the second centroid.

15. The movement sensor of claim 14, wherein the first magnetic sensor and the second magnetic sensor are configured on the semiconductor substrate to be subjected to a substantially uniform magnetic field.

16. The movement sensor of claim 14, wherein the first magnetic sensor has a length or width in a range of from about 150 microns to about 300 microns.

17. The movement sensor of claim 16, wherein the first magnetic sensor and the second magnetic sensor have a combined width or length on the semiconductor substrate of between about 100 microns and about 400 microns.

* * * * *